(12) United States Patent
Maheshwari et al.

(10) Patent No.: US 8,570,790 B2
(45) Date of Patent: Oct. 29, 2013

(54) MEMORY DEVICES AND METHODS FOR HIGH RANDOM TRANSACTION RATE

(75) Inventors: Dinesh Maheshwari, Fremont, CA (US); Bruce Jeffrey Barbara, Discovery Bay, CA (US); John Marino, Mountain View, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 56 days.

(21) Appl. No.: 13/340,246

(22) Filed: Dec. 29, 2011

(65) Prior Publication Data

US 2012/0243301 A1  Sep. 27, 2012

Related U.S. Application Data

(60) Provisional application No. 61/432,449, filed on Jan. 13, 2011, provisional application No. 61/472,607, filed on Apr. 6, 2011.

(51) Int. Cl.
*G11C 11/00* (2006.01)

(52) U.S. Cl.
USPC .................. 365/154; 365/230.05; 365/233.13

(58) Field of Classification Search
USPC ............ 365/154, 156, 230.05, 230.04, 233.1, 365/233.13
See application file for complete search history.

(56) References Cited

U.S. PATENT DOCUMENTS

| | | | |
|---|---|---|---|
| 6,449,685 B1 | 9/2002 | Leung | |
| 6,988,154 B2 * | 1/2006 | Latta | 710/240 |
| 7,082,071 B2 * | 7/2006 | Knaack et al. | 365/221 |
| 7,158,440 B2 * | 1/2007 | Duh et al. | 365/233.1 |
| 7,421,559 B1 * | 9/2008 | Yadav | 711/169 |
| 7,478,181 B2 | 1/2009 | Perego et al. | |
| 7,565,480 B2 * | 7/2009 | Ware et al. | 711/106 |
| 8,060,721 B1 * | 11/2011 | Yadav | 711/169 |
| 8,331,184 B2 * | 12/2012 | Wang | 365/222 |
| 8,446,755 B2 * | 5/2013 | Roy | 365/149 |
| 2006/0174081 A1 | 8/2006 | Latta | |
| 2008/0140916 A1 | 6/2008 | Oh et al. | |

OTHER PUBLICATIONS

International Search Report for International Application No. PCT/US12/32645 dated Jun. 20, 2012; 2 pages.
Koch. "Advances in Adaptive Computer Techonolgy" (online). Dated Dec. 1, 2004 Retrieved on May 28, 2012 Retrieved from the internet at URL http://www.esa.cs.tu-darmstadt.de/twiki/pub/staff/AndreasKochPublications/habil.pdf.
USPTO Non Final Rejection for U.S. Appl. No. 13/859,669 dated Jul. 8, 2013; 6 pages.
Written Opinion of the International Searching Authority for International Application No. PCT/US12/32645 mailed Jun. 20, 2012; 5 pages.

* cited by examiner

*Primary Examiner* — Gene Auduong

(57) ABSTRACT

A memory device can include a plurality of double data rate data (DDR) ports, each configured to receive write data and output read data on a same set of data lines independently and concurrently in synchronism with at least a first clock signal; an address port configured to receive address values on consecutive, different transitions of a second clock, each address value corresponding to an access on a different one of the data ports; and a memory array section comprising a plurality of banks, each bank providing pipelined access to storage locations therein.

20 Claims, 21 Drawing Sheets

MEMORY DEVICES AND METHODS FOR HIGH RANDOM TRANSACTION RATE

This application claims the benefit of U.S. provisional patent application Ser. No. 61/432,449 filed on Jan. 13, 2011, and Ser. No. 61/472,607 filed on Apr. 6, 2011, the contents of both of which are incorporated by reference herein.

TECHNICAL FIELD

The present disclosure relates generally to memory devices, and more particularly to memory devices that enable high random transaction rates.

DETAILED DESCRIPTION

Various embodiments will now be described that include memory devices, systems, and methods that enable high random data transaction rates. Embodiments can include multiple input/output (I/O) data ports that allow for read or write transactions at double data rates (i.e., on both rising and falling edges of a data clock).

Figure 1:
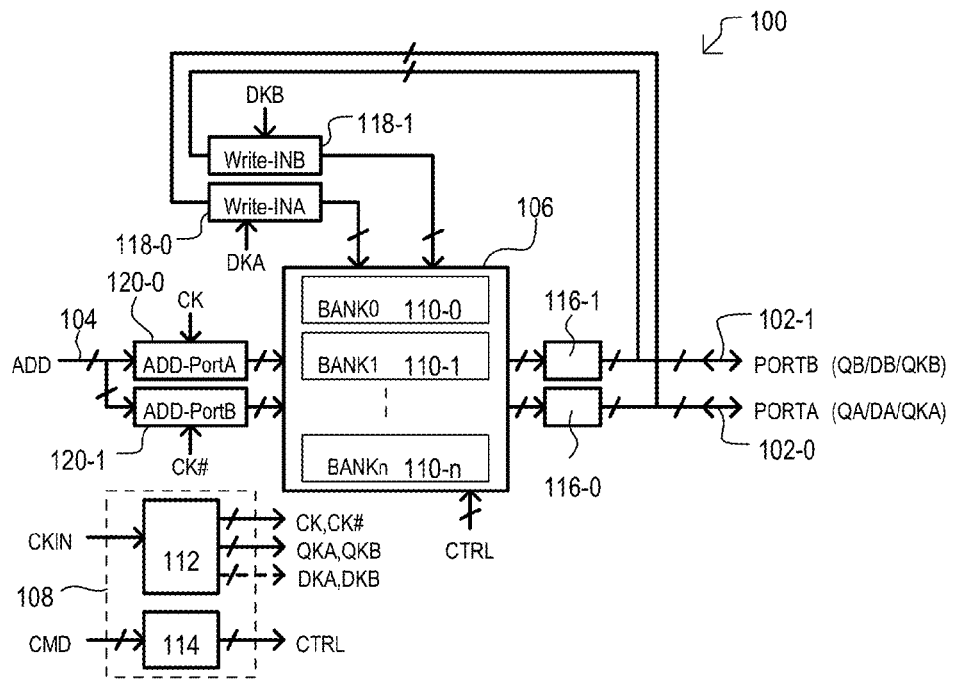
FIG. 1 is a block schematic diagram of a memory device according to one embodiment.

Referring now to FIG. 1, a memory device according to one embodiment is shown in a block schematic diagram and designated by the general reference character 100. A memory device 100 can include multiple data I/O ports 102-0/1, an address port 104, a memory array section 106, and a control section 108.

Data I/O ports (102-0/1) can provide bi-directional data accesses paths to storage locations within memory array section 106. That is, each of data ports (102-0/1) can output read data and input write data on a same set of conductive connections. Such conductive connections can include, but are not limited to, integrated circuit conductive traces and/or pads, as well as integrated circuit device bond wires, leads, pins, land/ball grid arrays, and circuit board traces.

In some embodiments, data I/O ports (102-0/1) can be independent. That is, each data I/O ports (102-0/1) can provide access for a different transaction (e.g., read or write operation). In response to one transaction, data can be input or output via one data port (e.g., 102-0 or 1). However, in response to an entirely different transaction data can also be input or output via another data port (e.g., 102-1 or 0). Different transactions can include different types of transactions (e.g., read versus a write), as well as transactions directed to unrelated storage locations within a memory array section (i.e., random transactions). Such independence can allow for highly randomized accesses to storage locations within a memory array section 106.

In addition or alternatively, data I/O ports (102-0/1) can enable concurrent operations. That is, while data is being input or output via one data port (e.g., 102-0 or 1), data can also be input or output via another data port (e.g., 102-1 or 0). In a particular embodiment, data can be input/output via one data port in response to one transaction, while data is being input/output via another data port in response to a different transaction. Such independent, concurrent data I/O port operations can allow for highly randomized, and rapid accesses to storage locations within a memory array section 106.

In some embodiments, data I/O ports (102-0/1) can be "double data rate" (DDR) ports, outputting and/or inputting data values in synchronism with both rising and falling edges of a data clock.

In the embodiment shown, each data I/O port (102-0/1) can provide inputs for write data values (DA/DB), outputs for read data values (QA/QB), and outputs for one or more read data clocks (QKA/QKB). Write data values (DA/DB) can be multi-bit values received in parallel on data I/O ports (102-0/1). In particular embodiments, individual write data values can be received in synchronism with both rising and falling edges of a corresponding write data clock (DKA/DKB). Similarly, read data values (QA/QB) can be multi-bit values output in parallel over data I/O ports (102-0/1). In particular embodiments, individual read data values can be output in synchronism with both rising and falling edges of a corresponding read data clock (QKA/QKB).

While FIG. 1 shows two data I/O ports (102-0/1), alternate embodiments can include more than two data I/O ports, each of which is independent, enables concurrent access, and operates at a double data rate.

An address port 104 can receive addresses corresponding to transactions for memory device 100. An address port 104 can receive individual address values on a same set of conductive connections. Such conductive connections can include, but are not limited to, those noted for the data I/O ports above.

In some embodiments, address port 104 can be a DDR port, receiving address values on both rising and falling edges of an address clock. In particular embodiments, an address port 104 receives complete addresses on both rising and falling edges of an address clock. That is, in such an embodiment, addresses applied to the memory device are not multiplexed address values.

A memory array section 106 can include one or more arrays of memory cells that provide data storage locations. Such storage locations can be accessed by transactions via data I/O ports 102-0/1. In the embodiment shown, a memory array section 106 can include a number of banks 110-0 to -n. Each bank (110-0 to -n) can be independently accessed by different transactions. Further, accesses to banks (110-0 to -n) can be pipelined (executed in sequential sections and/or steps). Accordingly, in some embodiments, as one bank is being accessed in response to a first transaction, a second access can commence in another bank, and the accesses can continue through both banks concurrently. Similarly, as one bank is being accessed in response to a first transaction, a second access can commence in the same bank, the second access following the first accesses in the pipeline operation of the bank.

In some embodiments, a bank can be selected for a transaction based on a portion of an address value received on address port 104. While FIG. 1 shows "n+1" banks, where n is an integer greater than two, other embodiments can include as few as two banks.

In one particular embodiment, a memory array section can include arrays of static random access memory (SRAM) type cells. Each SRAM cell can include a latch that can switch between two or more states.

A control section 108 can receive timing and control values for controlling operations in a memory device 100. In the particular embodiment shown, a control section 108 can include a clock generator circuit 112 and control logic 114. A clock generator circuit 112 can receive one or more input clocks (e.g., CKIN), and in response, generate various clocks to control operations within memory device 100. In the embodiment shown, a clock generator circuit 112 can generate an address/control (add/ctrl) clocks (CK/CK#), for latching address and control values, and read data clocks (QKA/QKB) for output on data I/O ports (102-0/1) with read data (QA/QB). It is understood that clock CK# is the complement of CK. In particular embodiments, add/ctrl clocks (CK/CK#)) and read data clock (QKA/QKB) can be synchronous with input clock(s) CKIN.

Control logic 114 can receive transaction data (CMD) and generate control signals (CTRL) from such transaction data. In one embodiment, control logic 114 can latch transaction data according to add/ctrl clocks (CK/CK#). In a particular embodiment, control logic 114 can latch transaction data with each address value received on address port 104, and thus identify the type of transaction (e.g., read, write) corresponding to the address value. Control logic 114 can include different transaction data inputs for each data I/O port (102-0/1).

Referring still to FIG. 1, in the embodiment shown, a memory device 100 can include data driver circuits 116-0/1, write data latches 118-0/1, and address latches 120-0/1. Each data driver circuit 116-0/1 can drive read data values (QA/QB) and corresponding read data clocks (QKA/QKB) on a corresponding data I/O port (102-0/1). Each write data latch 118-0/1 can latch write data values (DA/DB) on corresponding data I/O ports (102-0/1) in response to corresponding data write clocks (DKA/DKB).

Address latches 120-0/1 can latch address values received on address port 104 at a double data rate. In the embodiment shown, one address latch 120-0 can latch address values on a rising edge of CK, while the other address latch 120-1 can latch address values on a rising edge of CK# (which can be the complement of CK). In the embodiment shown, address values latched in address latch 120-0 can correspond to a transaction via data I/O port 102-0, while address values latched in address latch 120-1 can correspond to a transaction via data I/O port 102-1.

In this way, addresses for transactions directed to different DDR data I/O ports can be latched at a double data rate, to enable highly randomized accesses to storage locations in a memory device.

FIGS. 2A to 2D are timing diagrams showing operations of a memory device, like that of FIG. 1, according to embodiments. FIGS. 2A to 2D include a number of waveforms: CK shows an add/ctrl clock; CMD shows transaction input data (e.g., control inputs); ADD shows address values; QKA shows a read data clock for one data I/O port (Port A); DKA shows a write data clock for Port A; DQA shows data values on Port A; QKB shows a read data clock for another data I/O port (Port B); DKB shows a write data clock for Port B; and DQB shows data values on Port B. Each of FIGS. 2A to 2D shows different combinations of two transactions directed to different ports.

Figure 2A:
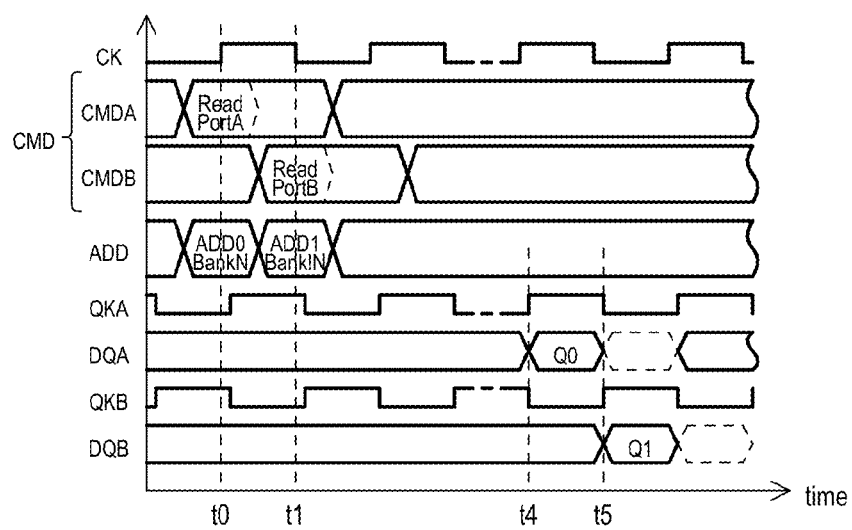
FIGS. 2A to 2D are timing diagrams showing operations of a memory device like that of FIG. 1.

Referring now to FIG. 2A, read-read transactions (i.e., a first read followed by a second read) will now be described.

At about time t0, CK can transition high and command data can indicate a read operation via Port A. At essentially the same time, a first address value (ADD0) on an address port can be latched. In the embodiment shown, such a first address value (ADD0) can be directed to one of many banks (BankN). In response to such command and address data, a memory device can start accessing BankN to read data therefrom at a location indicated by address ADD0.

At about time t1, CK can make a transition low in a same clock cycle. At this time, command data can indicate a read operation via Port B. At essentially the same time, a second address value (ADD1) on the same address port can be latched. In the embodiment shown, such a second address value (ADD1) can be directed to any bank but that accessed at time t0 (Bank!N). In response to such command and address data, a memory device can start accessing Bank!N to read data therefrom according to address ADD1.

It is understood that address values received at times t0 and t1 are complete; each identifying different memory locations for independent transactions. That is, address values ADD0 and ADD1 do not represent multiplexed portions of a single address.

At about time t4, a read data value (Q0) corresponding to the transaction indicated at time t0 can be output on Port A. Read data value (Q0) can be output in synchronism with read data clock QKA. In particular, read data value (Q0) can follow a rising transition of read data clock QKA a set read latency following receipt of the corresponding transaction data at time to. In one embodiment, read data can be output in a burst of two or more data values, in which case read data can continue to be output on Port A on each half-cycle of read data clock QKA (i.e., at a double data rate).

At about time t5, a read data value (Q1) corresponding to the transaction indicated at time t1 can be output on Port B. Like the read data value (Q0) for Port A, read data value (Q1)

can be output in synchronism with read data clock QKB, following a read latency, and can be output in a burst of two or more read data values.

Figure 2B:
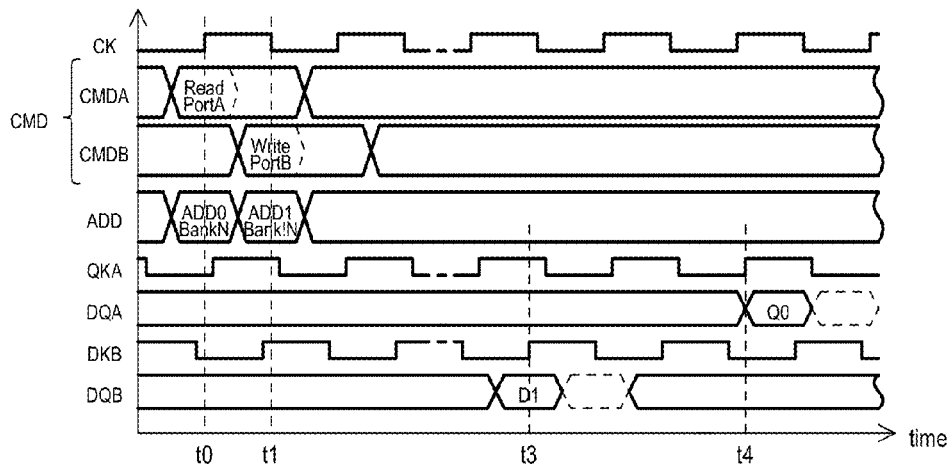

Referring now to FIG. 2B, a read-write transaction sequence will now be described. The read transaction shown in FIG. 2B can occur in the same fashion as the first read transaction of FIG. 2A, thus a description of the operation is omitted.

FIG. 2B differs from FIG. 2A in that at about time t1, CK can make a transition low while command data indicates a write operation via Port B. At essentially the same time, a second address (ADD1) on the same address port can be latched. In the embodiment shown, like FIG. 2A, such a second address (ADD1) can be directed to any bank but that accessed at time t0 (Bank!N). In response to such command and address data, a memory device can start accessing Bank!N to prepare for write data.

At about time t3, following a write latency, write data value (D1) can be driven on Port B. Such write data can be latched in synchronism with a write data clock. In the particular embodiment shown, such write data can be latched on a rising edge of write data clock DKB. In one embodiment, write data can be input in a burst of two or more data values, in which case write data can continue to be latched on each half-cycle of write data clock DKB (i.e., at a double data rate).

At time t4, read data (Q0) corresponding to the read transaction initiated at time t0 can be output on Port A.

Figure 2C:
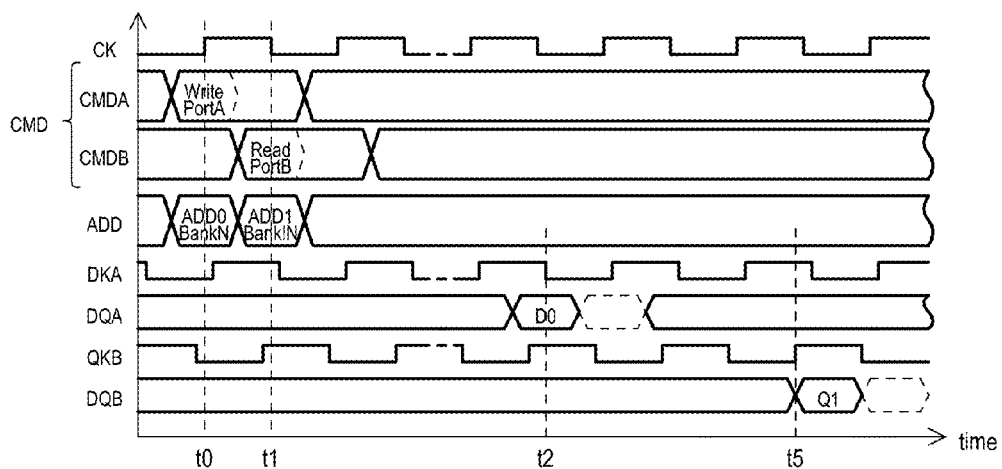

Referring now to FIG. 2C, a write-read transaction sequence is shown. The read transaction shown in FIG. 2C can be the same as the second read transaction of FIG. 2A, thus a description of the operation is omitted.

FIG. 2C differs from FIG. 2A in that at about time t0, CK can transition high and command data can indicate a write operation via Port A. At essentially the same time, a first address value (ADD0) on an address port can be latched. Such a first address value (ADD0) can be directed to one of many banks (BankN). In response to such command and address data, a memory device can start accessing BankN to prepare for write data.

At time t1, a read transaction can be initiated. A second address value (ADD1) corresponding to such a read transaction can be directed to a bank different from that of the previous write transaction (Bank!N).

At about time t2, following a write latency, write data value (D0) can be driven on Port A. Such write data can be latched on a rising edge of write clock DKA, and can be a burst of data, as described above.

Figure 2D:
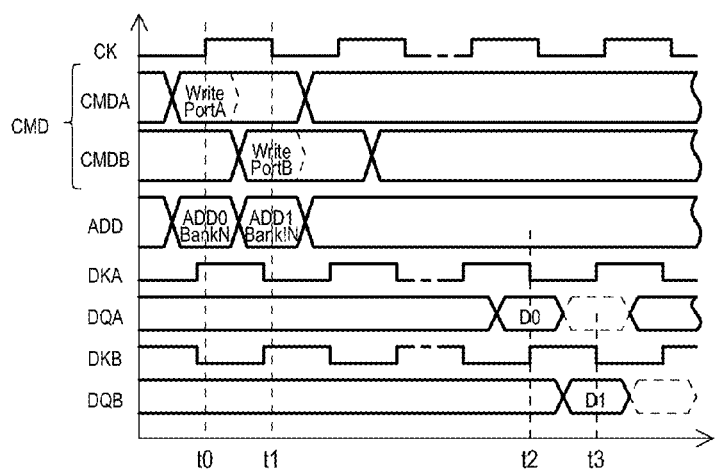

Referring now to FIG. 2D, a write-write transaction sequence is shown. The first write transaction shown in FIG. 2D can be the same as the write transaction of FIG. 2C. In addition, the second write transaction shown in FIG. 2D can be the same as the write transaction of FIG. 2B. Accordingly, detailed descriptions of the operations are omitted. It is noted that a second address value (ADD1) corresponding to the second write transaction can be directed to a bank different from that of the previous write transaction (Bank!N).

Referring once again to FIGS. 2A to 2D, in the embodiments shown, transaction input data (CMD) can include one part (CMDA) that indicates accesses to one port (Port A) and another part (CMDB) that indicates accesses to a different port (Port B). In some embodiments, such different transaction data can be received at a slower data rate than address inputs (ADD) and/or data inputs/outputs (DQA/DQB). In a particular embodiment, each different transaction data part (CMDA, CMDB) can be received at a single data rate (SDR) (once per cycle), while an address port (e.g., ADD) and data I/O ports (e.g., DQA/DQB) can be DDR ports.

In this way, a memory device can initiate any combination of read and write transactions, directed to different data I/O ports, on consecutive, different transitions of a clock.

Figure 3:
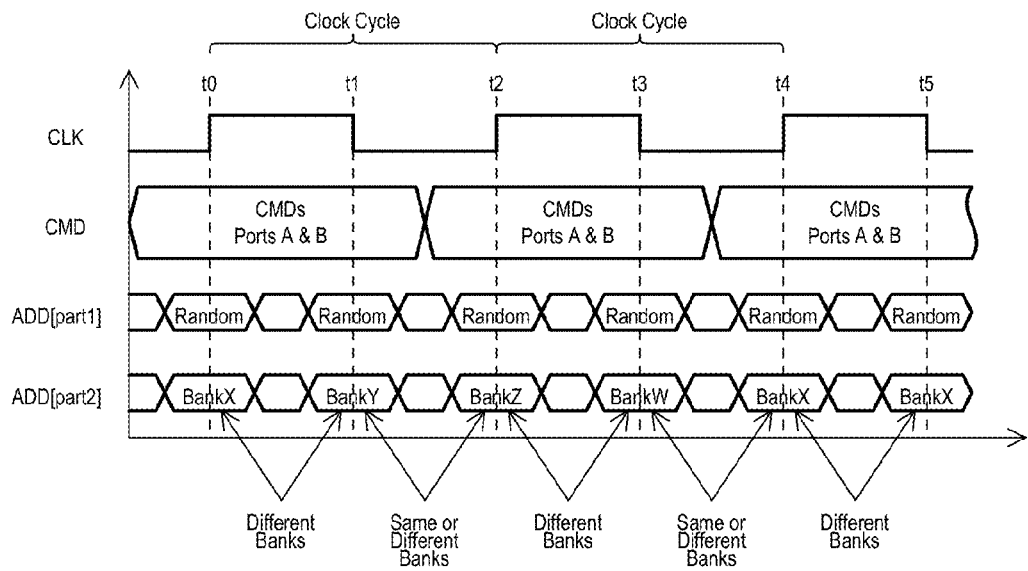
FIG. 3 is a timing diagram showing operations of a memory device according to another embodiment.

Referring now to FIG. 3, memory device operations according to further embodiments are shown in a timing diagram. FIG. 3 is a timing diagram that includes waveforms for an add/ctrl clock CLK; transaction data (CMD), a first part of a received address value (ADD[part1]); and a second part of the same received address value (ADD[part2]). CLK can be a signal like that in above embodiments, which is used to latch address values at a double data rate. Transaction data (CMD) can represent two transactions directed to different data I/O ports (Port A and Port B) received in a same clock cycle. In a particular embodiment, transaction data for one data I/O port (e.g., Port A) can be latched on a rising edge of CLK, while transaction data for another data I/O port (e.g., Port B) can be latched on a falling edge of a CLK.

First address part ADD[part1] can identify a location within an accessed bank that is the target of one of the transactions in the same clock cycle. A second address part ADD[part2] can identify a bank for the transaction.

FIG. 3 shows "valid" and "invalid" transactions based on bank access according to one embodiment. Valid transactions can result in accesses to the identified bank over the corresponding data I/O port. Invalid transactions can result in a bank not being accessed. In some embodiments, a memory device can generate an indication in response to some, or all, invalid transactions. In a very particular embodiment, a memory device can provide a data valid signal with read data, and such a data valid signal can be asserted to an invalid state in the event of an invalid read transaction. The validity of a transaction can be based on a bank accessed, as will be described below.

According to one embodiment, transactions initiated on a rising edge of CLK cannot be invalid transactions. Thus, a second address part ADD[part2] received on a rising edge of CLK can identify any of multiple banks in a memory device. Referring to FIG. 3, values for ADD[part2] at times t0, t2 and t4 (rising edges of CLK) have no bank restrictions.

In contrast, transactions initiated on a falling edge of CLK are invalid only if they are directed to the same bank as the transaction initiated on the immediately preceding rising edge of CLK. Referring to FIG. 3, at time t1, second address part ADD[part2] is directed to "Bank Y". To be valid, Bank Y must be different from "Bank X", which is the bank identified as time t0. It is noted such a bank restriction occurs only within a same clock cycle. Thus, at time t2 (start of a next clock cycle), second address part ADD[part2] is directed to "Bank Z". Because time t2 corresponds to a rising edge of CLK, Bank Z can be the same as Banks Y or X, or can be different than Banks Y or X.

In this way, read or write transactions can be initiated on different edges of a same clock cycle, with transactions for one edge type always being valid, and transactions for the other edge type being invalid only when directed to the same bank as the other transaction of the same clock cycle.

As noted above, memory devices according to embodiments can include memory array sections with multiple banks, in which operations in each bank can be independent and pipelined. Embodiments showing such operations will now be described.

FIGS. 4A to 4F are a series of block schematic diagrams showing pipelined operations through different banks according to an embodiment. FIGS. 4A to 4F show a memory device 400 that can include sections like those of FIG. 1, or equivalents. Such like sections are referred to by the same reference character but with the first digit being a "4" instead of a "1".

FIGS. 4A to 4F differ from FIG. 1 in that a memory array section 406 is shown to include a decoder section 422 and an I/O section 424. A decoder section 422 can receive address values from address latches 420-0/1, and in response, enable access to a storage location within a bank indicated by the address value. An I/O section 424 can enable read data paths between banks (410-0 to -n) and data I/O ports 402-0/1. In addition, an I/O section 424 can enable write data paths between write data latches 418-0/1 and banks (410-0 to -n). FIGS. 4A to 4F also differ from FIG. 1 in that they show a data selection circuit 426. A data selection circuit 426 can selectively provide one write data value from multiple write data latches 418-0/1 to I/O section 424.

FIGS. 4A to 4F show two consecutive write transactions initiated on consecutive, different transitions of a first clock (CLK).

Figure 4A:
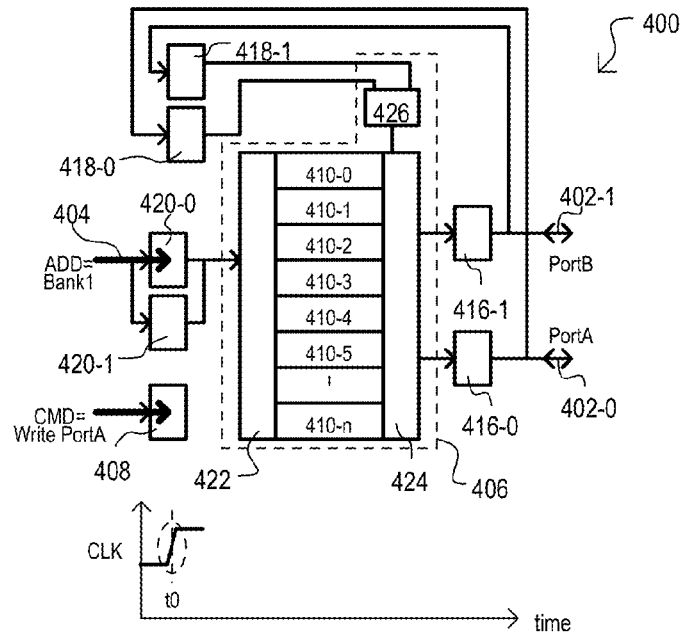
FIGS. 4A to 4F are a sequence of block schematic diagrams showing pipelined bank operations of a memory device according to embodiments.

Referring to FIG. 4A, synchronous with a first transition of a clock signal CLK (in this embodiment a rising transition at time t0), a first address value can be latched in address latch 420-0. In the embodiment shown, such an address can identify Bank1 (410-1). Further, transaction data received by control section 408 can indicate a write transaction. Such a write transaction can be via data I/O port 402-0. Data paths for values latched at time t0 are shown with bold lines in FIG. 4A.

In some embodiments, a memory device 400 can include transaction (e.g., command) data inputs dedicated to each of multiple data I/O ports. Such inputs can identify a data I/O port for an indicated transaction. However, in other embodiments, a time at which an address value and/or transaction data is received can indicate the corresponding data I/O port (e.g., if received in a rising edge of CLK, the transaction is via one data I/O port, if received in a falling edge of CLK, the transaction is via another data I/O port).

Figure 4B:
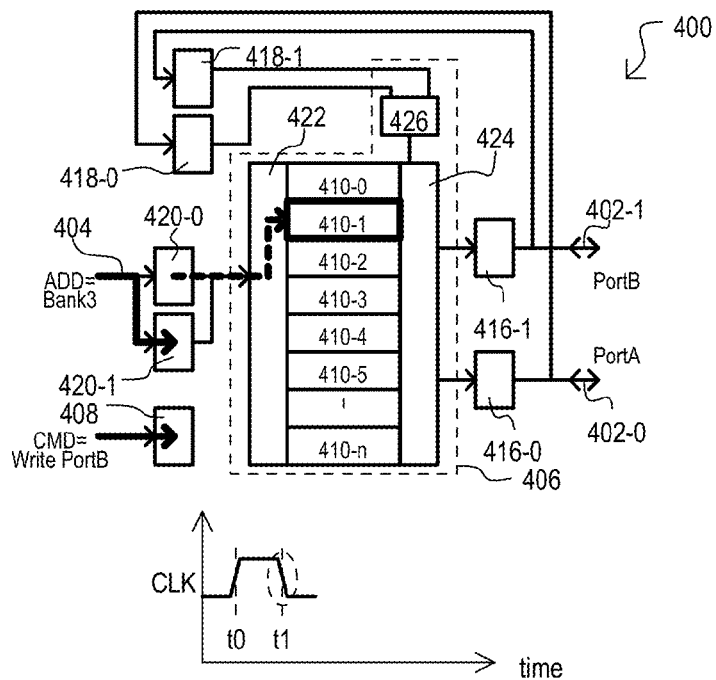

Referring to FIG. 4B, synchronous with a second transition immediately following the first transition of a clock signal CLK (in this embodiment a falling transition at time t1), a second address value can be latched in address latch 420-1. Data paths for values latched at time t1 are shown with solid bold lines in FIG. 4B. In the embodiment shown, such an address value identifies a different bank (Bank3, 410-3) than the previous transaction at time t0. In a particular embodiment, a memory device 400 can include valid and invalid transactions, like those shown in FIG. 3, in which transactions on a second transition of CLK must be directed to a different bank than an immediately preceding transition of the same clock cycle. Referring still to FIG. 4B, at or after time t1, Bank1 410-1 can be accessed in response to the first address value latched within address latch 420-0. The access of Bank1 410-1, corresponding to the previous transaction initiated at time t0, is represented by a dashed bold line in FIG. 4B.

Figure 4C:
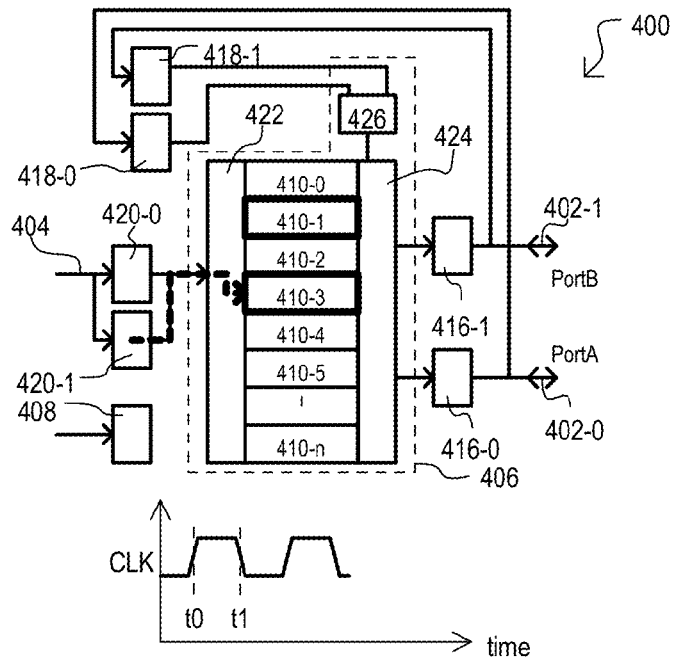

Referring to FIG. 4C, after time t1, Bank3 410-3 can be accessed in response to the second address value latched within address latch 420-1. The access of Bank3 410-3 is represented by a dashed bold line in FIG. 4C. In some embodiments, as Bank3 is starting to be accessed, pipelined operations can continue with regard to the write operation to Bank1 410-1.

Figure 4D:
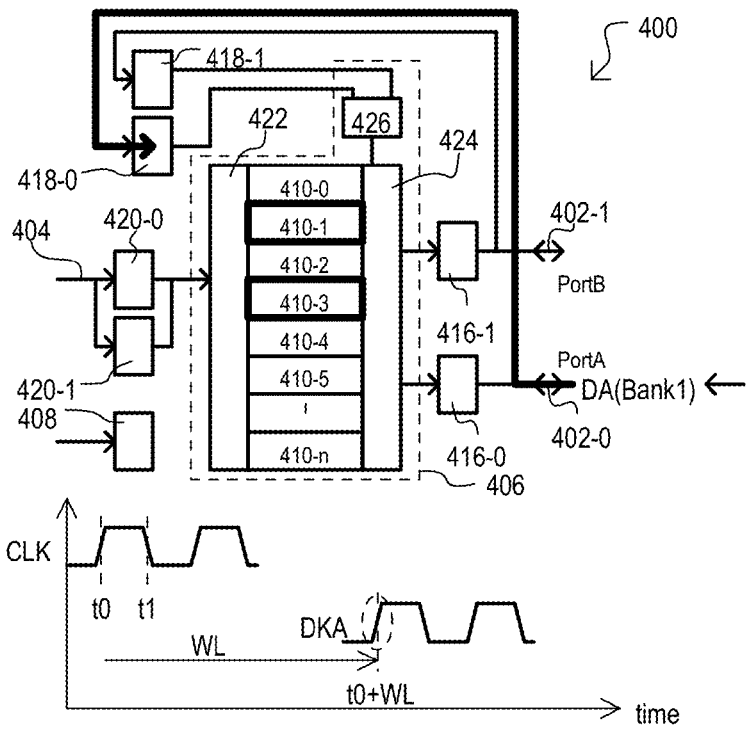

Referring to FIG. 4D, in the embodiment shown, following a write latency delay (WL), write data for Bank1 (DA (Bank1)) can be driven on data I/O port 402-0 and latched synchronous with a first transition of a write data clock DKA (in this embodiment a rising transition at about time t0+WL). The data path for write data values latched at time t0+WL is shown with a bold line in FIG. 4D. In some embodiments, at this time, independent pipelined operation can continue for Bank1 410-1 and Bank3 410-3.

Figure 4E:
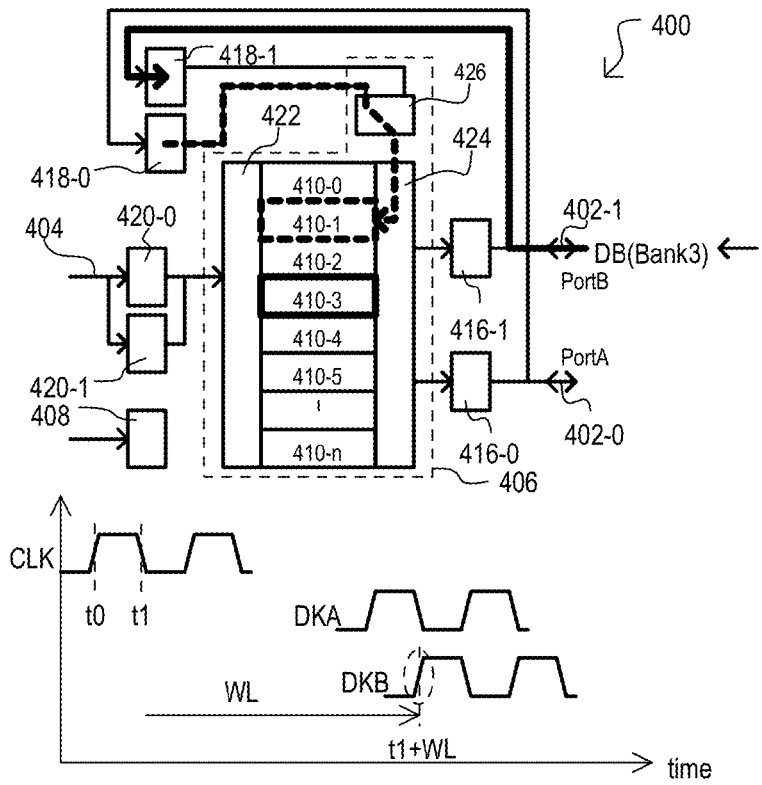

Referring to FIG. 4E, in the embodiment shown, following a write latency delay (WL), write data for Bank3 (DB (Bank3)) can be driven on data I/O port 402-1 and latched synchronous with a first transition of a write data clock DKB (in this embodiment a rising transition at time t1+WL). The data path for write data values latched at time t1+WL is shown with a bold line in FIG. 4E. On or after time t1+WL, write data within write data latch 418-0 can be applied to its intended bank (Bank1 410-1) through data select circuit 426. The application of write data to Bank1 410-1 is shown by a bold dashed line.

Figure 4F:
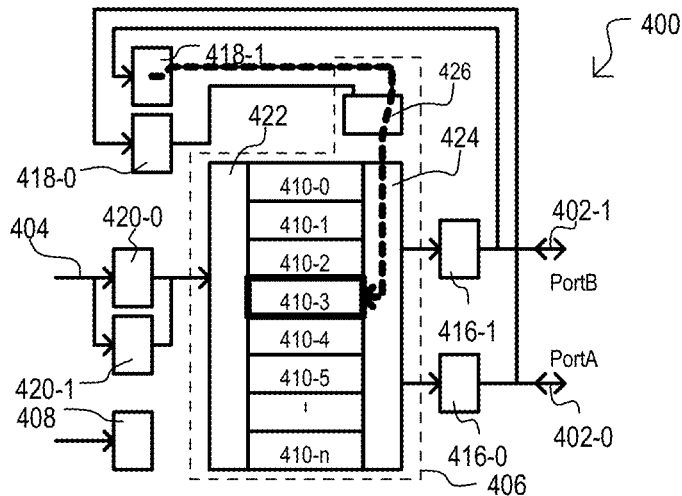

Referring to FIG. 4F, after time t1+WL, write data within write data latch 418-1 can be applied to its intended bank (Bank3 410-3) through data select circuit 426. The application of write data to Bank3 410-3 is shown by a bold dashed line.

FIGS. 5A to 5F are a series of block schematic diagrams showing additional pipelined operations for memory device 400, shown in FIGS. 4A to 4F.

FIGS. 5A to 5F show two consecutive read transactions initiated on consecutive, different transitions of a first clock (CLK).

Figure 5A:
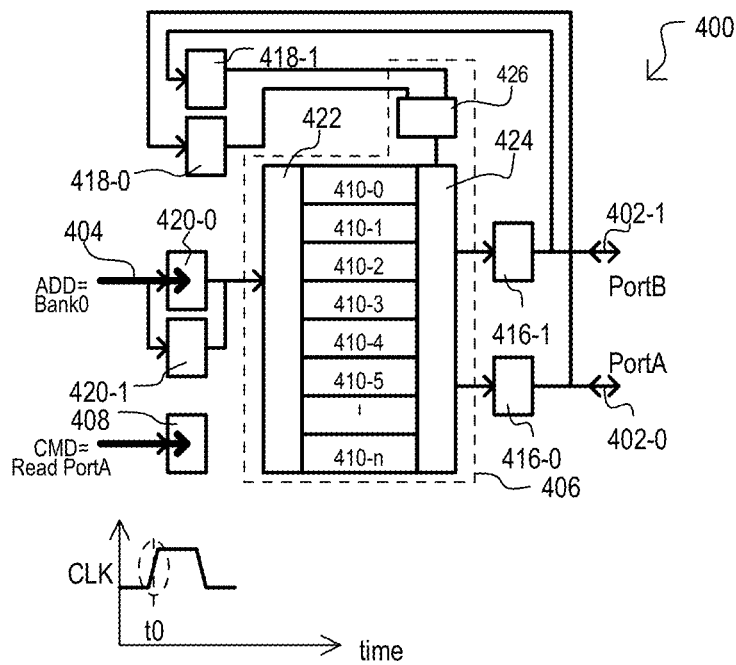
FIGS. 5A to 5F are a sequence of block schematic diagrams showing pipelined bank operations of a memory device according to further embodiments.
Figure 5B:
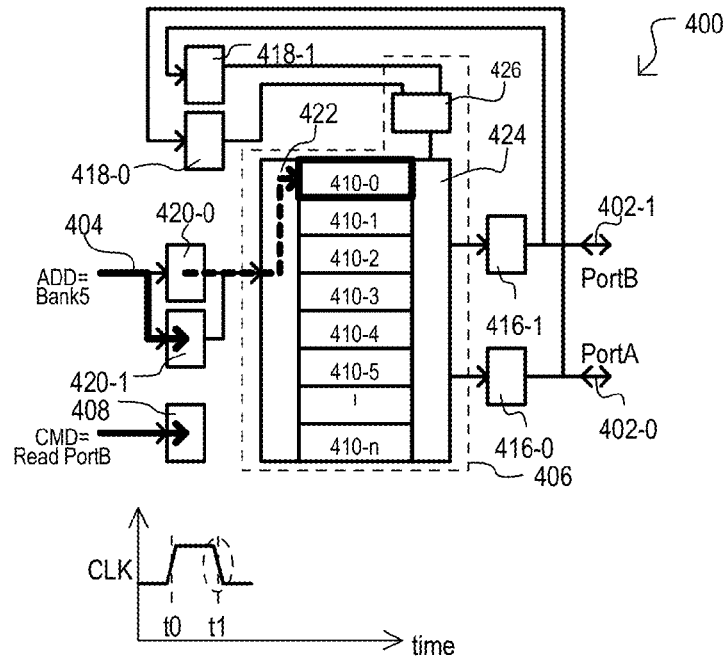

FIG. 5A shows a latching of a first address value and first transaction data like that of FIG. 4A, but with the transaction data indicating a read transaction directed to Bank0 410-0. FIG. 5B shows a latching of a second address value and second transaction data like that of FIG. 4B, but with the transaction data indicating a second read transaction to Bank5 410-5. As in the case of FIGS. 4A and 4B, data paths for latched values are shown with solid, bold lines.

Referring still to FIG. 5B, after time t0, Bank0 410-0 can be accessed in response to the first address value latched within address latch 420-0. The access of Bank0 410-0 is represented by a dashed bold line in FIG. 5B.

Figure 5C:
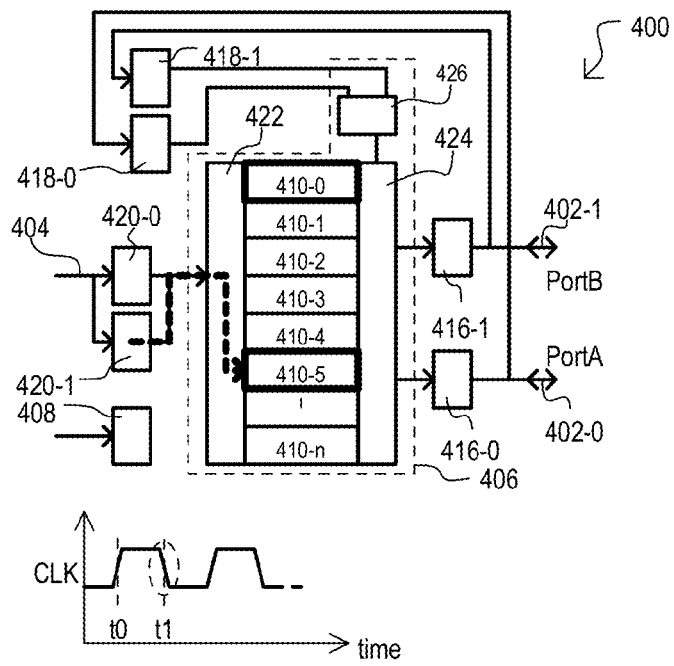

Referring to FIG. 5C, after time t1, Bank5 410-5 can be accessed in response to the second address value latched within address latch 420-1. In some embodiments, as Bank5 410-5 is starting to be accessed, pipelined operations can continue with regard to the read operation to Bank0 410-0. The access of Bank0 410-5 is represented by a dashed bold line in FIG. 5C.

Figure 5D:
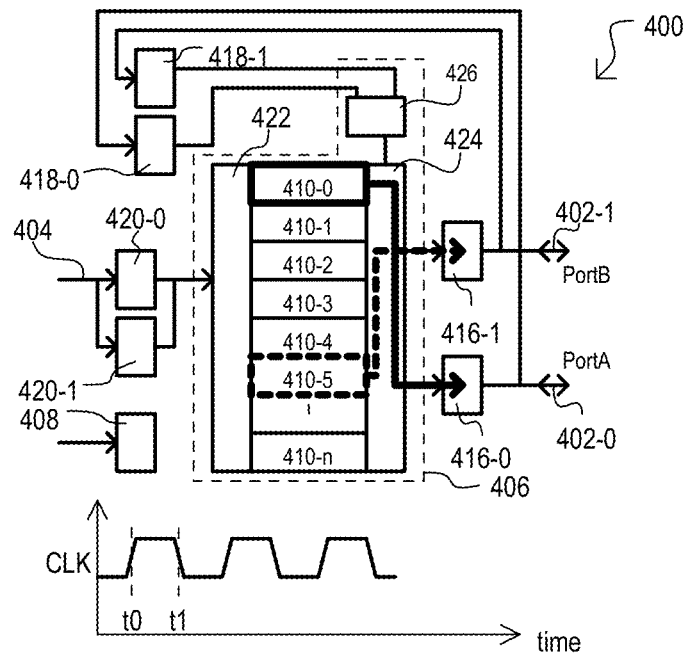

Referring to FIG. 5D, pipelined read operations directed to Bank0 410-0 can result in read data (QA(Bank0)) being output from Bank0 410-0 to data driver circuit 416-0. Such an action is shown with a solid, bold line. In some embodiments, as read data is output from Bank 0 410-0, pipelined read operations can continue within Bank5 410-5. Such operations can subsequently result in result in read data (QB(Bank5)) being output from Bank5 410-5 to data driver circuit 416-1. Such an action is shown with a dashed, bold line.

Figure 5E:
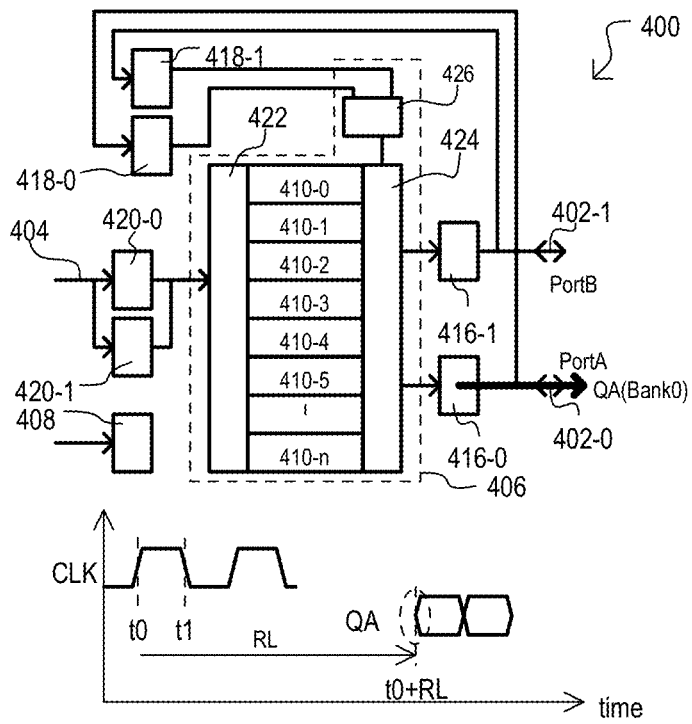

Referring to FIG. 5E, following a read latency delay (RL), read data for Bank0 (QA(Bank0)) can be output by data driver circuit 416-0 on data port 402-0 (e.g., at about time t0+FRL). Such an action is shown with a solid, bold line. In some embodiments, read data (QA(Bank0)) can be output in a burst of two or more read data values in synchronism with a read data clock (not shown).

Figure 5F:
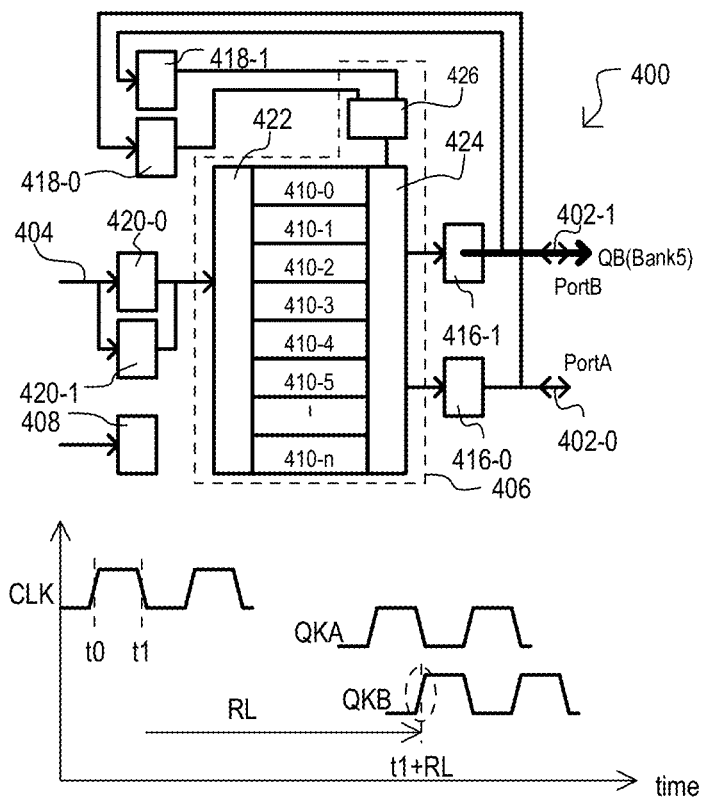

Referring to FIG. 5F, following a read latency delay (RL), read data for Bank5 (QB(BankB)) can be output by data driver circuit 416-1 on data port 402-1 (e.g., at about time t1+RL). As in the case of FIG. 5E, such an action is shown with a solid bold line. Further, in some embodiments such read data can include a burst of two or more read data values in synchronism with a read data clock.

While FIGS. 4A to 4F show two write transactions and FIGS. 5A to 5F show two read transactions, it is understood that memory device 400 can include mixes of different transactions, including read-write and write-read transactions. Such mixed transactions are understood from the description above, and can include independent pipelining through different banks as described above.

As noted above, embodiments can include memory devices with pipelined operations to enable high speed transactions. Examples of such pipelining will now be described.

Figure 6:
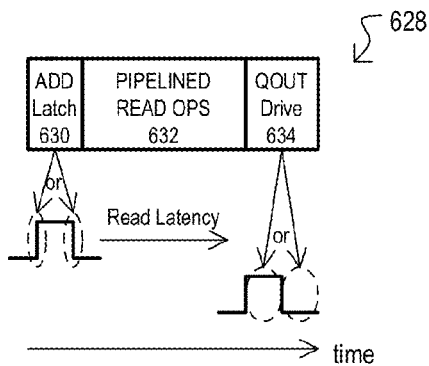
FIG. 6 is a diagram showing a pipelined bank read operation that can be included in embodiments.

Referring now to FIG. 6, a pipelined bank read operation 628 is represented in a diagram showing a sequence of actions/operations performed in time. In such a pipelined operation, an address value can be latched 630 on either a rising or falling edge of a clock signal (CLK). Read operations can occur within a memory device 632 to access an addressed storage location to generate read data. Read data can then be driven 634 at an output of the memory device, in synchronism with a rising or falling edge of a data clock (QK). Accordingly, in the embodiment shown, address latching 630 and read data driving 632 can be synchronous actions, occurring according to timing of clock signal(s).

According to embodiments, all or a portion of read operations within a memory device (i.e., actions/operations 632) can be synchronous (e.g., occur in response to a clock signal) or asynchronous. Further, read operations (632) can include multiple pipeline stages, each of which can be synchronous or asynchronous.

Figure 7:
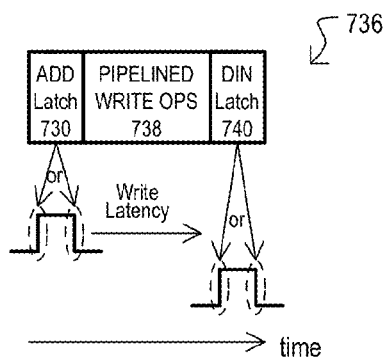
FIG. 7 is a diagram showing a pipelined bank write operation that can be included in embodiments.

Referring now to FIG. 7, a pipelined bank wrote operation 736 is represented in a diagram showing a sequence of actions/operations performed in time. Address latching 730 can occur as described for FIG. 6. Write operations can occur within a memory device 738 to access an addressed storage location to enable data to be written into such a location. Write data can be latched 740 in synchronism with a rising or falling edge of a data clock (DK). Accordingly, in the embodiment shown, address latching 730 and write data latching 740 can be synchronous actions, occurring according to timing of clock signal(s).

As in the case of read operations 632 of FIG. 6, according to embodiments, all or a portion of write operations within a memory device (i.e., actions/operations 738) can be synchronous or asynchronous. Further, such write operations (738) can include multiple pipeline stages, each of which can be synchronous or asynchronous.

Figure 8:
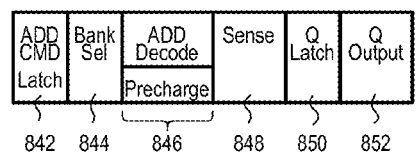
FIG. 8 is a diagram showing another pipelined bank read operation that can be included in embodiments.

Referring to FIG. 8, a pipelined bank read operation 828 according to another embodiment is shown in a diagram. FIG. 8 shows various actions/operations that can occur in a bank read operation, and can be one particular implementation of that shown in FIG. 6.

Pipelined bank read operation 828 can include latching address and transaction data 842. In one embodiment, each address value can identify a bank, as well as a storage location within such a bank. Transaction data can indicate a read transaction. In some embodiments, such an action can include latching address values at a double data rate, where each such address value corresponds to different transaction, as described above. In some embodiments, such an action can also include providing transaction data at a slower data rate than address values.

A pipelined bank read operation 828 can include a bank selection action 844. Such an action can include determining which bank to access in a transaction. In some embodiments, a bank selection action 844 can determine whether a transaction is valid or invalid based on bank access. In the case of an invalid transaction, a bank selection action 844 can prevent access to the bank. A pipelined bank read operation 828 can further include memory array preparation operations 846. In the embodiment shown, preparation operations 846 can include address decoding and array precharging. Address decoding can include decoding a received address value to access a storage location in the bank. Array precharging can include placing portions of the bank (e.g., bit lines), at a predetermined potential that enables sensing of data values.

FIG. 8 further shows a sense action 848, read data latch action 850, and a read data output action 852. A sense action 848 can sense a read data value from storage location accessed in the read operation with sense amplifiers or the like. In embodiments that provide bursts of read data values, a sense action 848 can sense all data in a burst in one action, or can sequentially sense data values. A read data latch action 850 can store a read data value for subsequent output by a memory device. As in the sense action, such an action can latch all data for a burst in one action, or can sequentially latch burst data values. A read data output action 852 can include driving read data values on a data I/O port.

According to embodiments, latching address and transaction data 842 can be synchronous with a timing clock. Similarly, the output of read data values can also be synchronous with a timing clock. Any of actions 844, 846, 848 and 850 can be synchronous with a clock or can be asynchronous.

Figure 9:
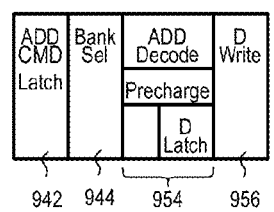
FIG. 9 is a diagram showing another pipelined bank write operation that can be included in embodiments.

Referring to FIG. 9, a pipelined bank write operation 936 according to another embodiment is shown in a diagram. FIG. 9 shows various actions/operations that can occur in a bank write operation, and can be one particular implementation of that shown in FIG. 7.

Pipelined bank write operation 936 can include latching address and transaction data 942 as described for 842 of FIG. 8, but with transaction data indicating a write data. A bank selection action 944 can determine bank to access in a transaction, and in some embodiments, can prevent bank access in an invalid transaction.

A pipelined bank write operation 936 can further include memory array preparation and write data latching operations 954. In the embodiment shown, preparation operations 954 can include address decoding and precharging as described for FIG. 8. However, in addition, received write data values can also be latched at this time. In embodiments that provide bursts of write data values, preparation operations 954 can latch bursts of write data at a double data rate.

FIG. 9 further shows a write data action 956. A write data action 956 can include writing latched write data values to a storage locations accessed by a decoded address value with write amplifiers, or the like. In embodiments that provide bursts of write data values, a write data action 956 can write all data in a burst in one action, or can sequentially write data values.

According to embodiments, latching address and transaction data 942 can be synchronous with a timing clock. Similarly, the latching of write data values during 954 can also be synchronous with a timing clock. Any of actions 944, 956 and other portions of 954 can be synchronous with a clock or asynchronous.

Pipelined operations through memory device banks, in combination with DDR address value latching directed to multiple data I/O ports, can enable very high speed, high random transactions. Such high speed, highly randomized transactions according to one embodiment are shown in FIG. 10.

Figure 10:
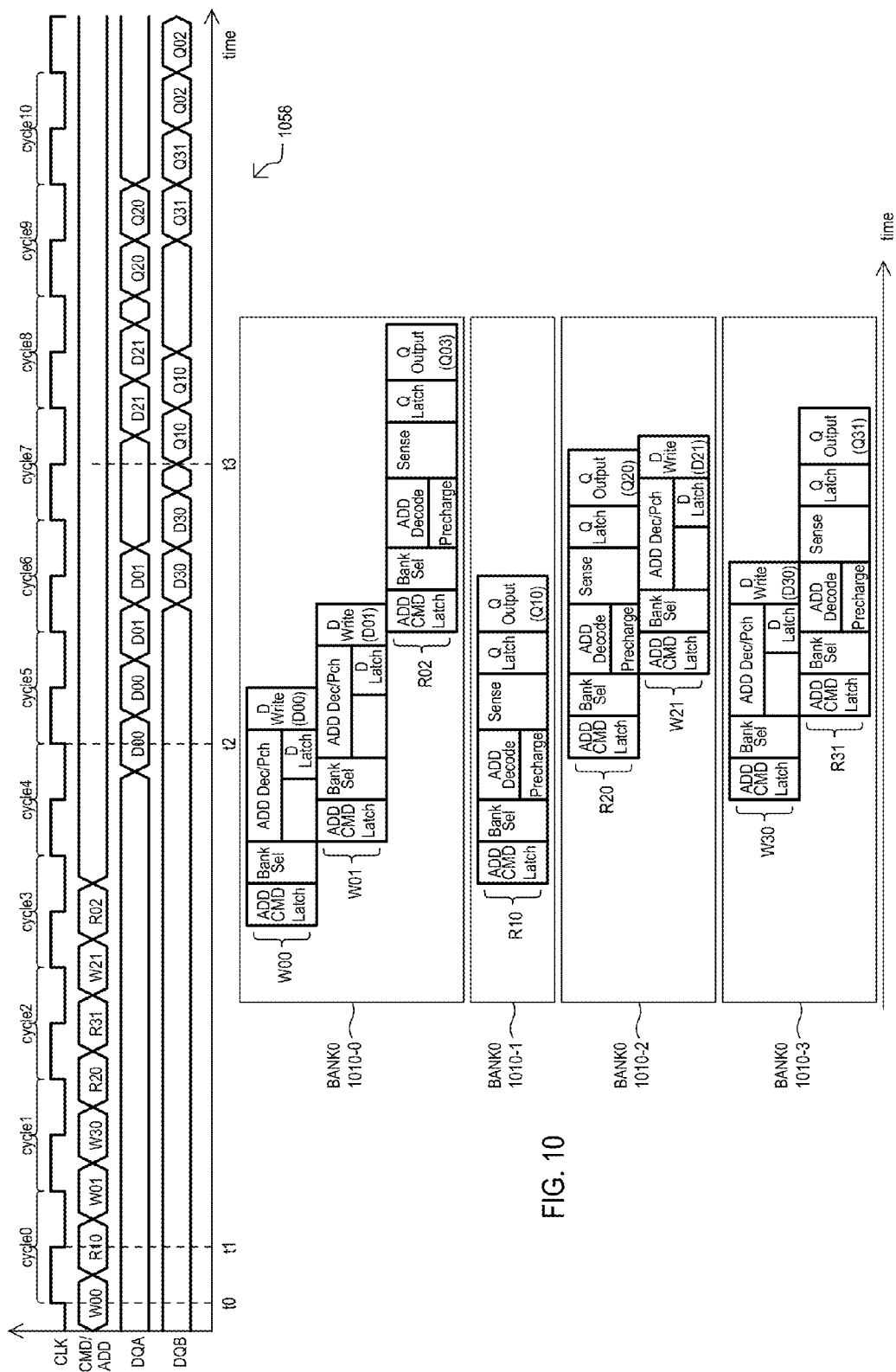
FIG. 10 shows a timing diagram of highly random transactions to a memory device according to an embodiment, along with corresponding pipelined accesses through banks of the memory device.

FIG. 10 includes a timing diagram 1058 showing examples of highly random transactions. FIG. 10 also includes representations of pipelined accesses through banks 1010-0 to -3 in response to such transactions.

Timing diagram 1058 shows sequence of transactions and a corresponding activity on multiple data I/O ports. Timing diagram 1058 includes the waveforms: CLK, which shows a timing clock, CMD/ADD which shows transaction and address data for each transaction, DQA which is one data I/O port, and DQB which is another data I/O port. Transactions represented by CMD/ADD are shown as Wxy or Rxy, where W represents a write transaction, R represents a read transaction, x identifies a bank, and y indicates the order of access to a bank (i.e., y=0 is a first access to the bank, y=1 is a next access to that same bank, etc.). In addition, in the embodiment of FIG. 10, transactions initiated on a rising edge of a CLK are directed to data I/O port DQA, and transactions initiated on a falling edge of a CLK are directed to data I/O port DQB.

Banks 1010-0 to -3 show transactions from timing diagram 1058 as they pipeline independently through each bank. In the embodiment shown, pipelined accesses can take the form of those shown in FIGS. 8 and 9, but other embodiments can include accesses having different operation components, operation orders, and/or operations overlapping in time.

In more detail, a first write transaction (W00) can be issued at time t0 on a rising edge of CLK, and hence be directed to data I/O port DQA. As shown in BANK0 1010-0, pipelined write operation for W00 can start with a latching of transaction and address values. Write data corresponding to transaction W00, shown as D00, can be driven on data I/O port DQA at time t2. In the embodiment shown, write data values D00 can be a burst of two data values. It is noted that write data (D00) can be latched according to CLK, or relative to another clock having a predetermined minimum phase difference with respect to CLK.

A next transaction at time t1 can be a read transaction (R10) issued to BANK1 1010-1. BANK1 1010-1 shows pipelined read operations for transaction R10. Read data corresponding to transaction R10, shown as Q10, can be output on data I/O port DQB at time t3. In the embodiment shown, read values Q10 can be a burst of two data values. It is noted that read data (Q10) can be output in synchronism with CLK, or in synchronism with another clock having a predetermined minimum phase difference with respect to clock CLK.

Remaining transactions in the sequence (i.e., W01, W30, R20, R31, W21, R02) are understood from the above description. Such transactions represent but one example of highly random accesses that vary both in type (e.g., read or write) as well as addressed locations. Reference to data I/O port waveforms DQA and DQB shows that data streams from different transactions can flow concurrently over the different data I/O ports.

In this way, highly random accesses can be accommodated using concurrent input and output data streams on multiple data I/O ports.

Figure 11A:
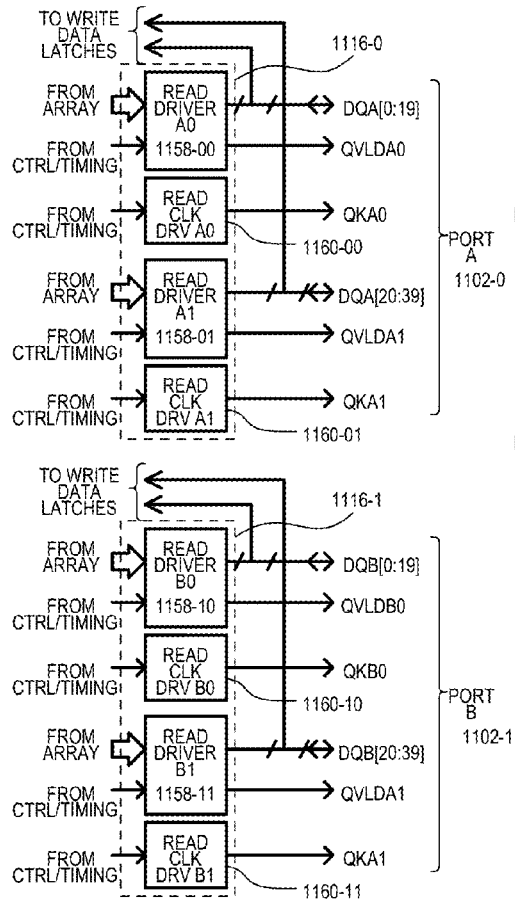
FIGS. 11A to 11C show a schematic block diagram and timing diagrams of divided data input/output (I/O) ports that can be included in embodiments.
Figure 11B:
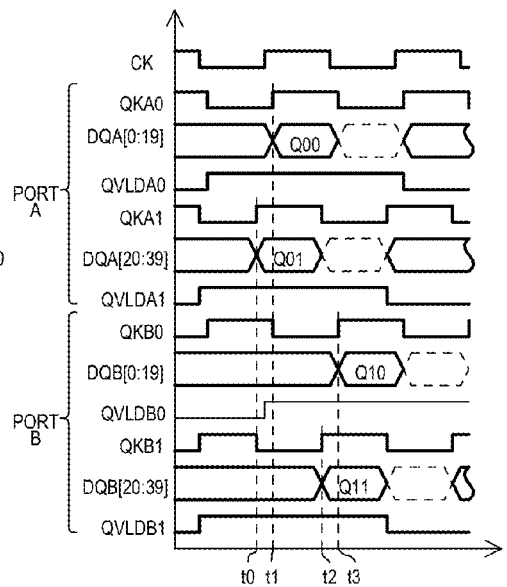
Figure 11C:
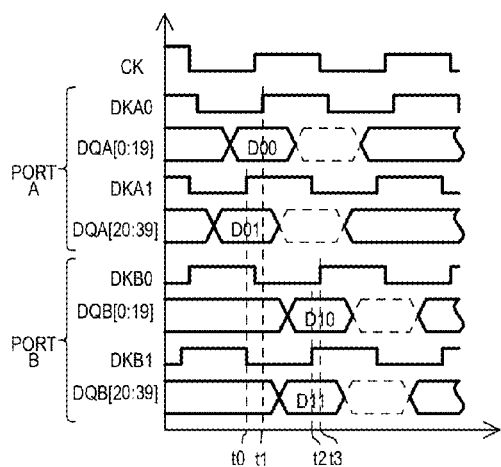

While embodiments can include data I/O ports that output read data according to one clock signal, alternate embodiments can divide a data I/O port into two or more groups. One embodiment having divided data I/O ports is shown in FIGS. 11A to 11C. FIG. 11A is a block schematic diagram showing two data I/O ports 1102-0/1. FIGS. 11B and 11C are timing diagrams showing data accesses over data I/O ports of FIG. 11A.

Referring to FIG. 11A, data I/O ports 1102-0/1 can have a same structure, accordingly, only data I/O port 1102-0 will be described in detail. A data I/O port 1102-0 can include data lines (40 data lines in the embodiment shown) split into two groups of twenty (DQA[0:19] and DQA[20:39]). A data I/O port 1102-0 can include read data driver circuit 1116-0, which can include can include read data drivers 1158-00/01 that can each drive a portion of an output data value on a corresponding group of data lines DQA[0:19]/DQA[20:39]. In the embodiment shown, a read data driver 1158-00 can also drive a data valid signal QVLDA0 that indicates whether or not read data on the corresponding data line group (DQA[0:19]) is valid. A read data clock driver 1160-00 can drive a read data clock QKA0. Data on data line group (DQA[0:19]) can be output in synchronism with read data clock QKA0. In a similar fashion, a read data driver 1158-01 can drive a portion of a read data value on a corresponding group of data lines DQA[20:99] as well as a data valid signal QVLDA1. A read data clock driver 1160-01 can provide a read data clock QKA1.

A read data clock (QKA0/1) and valid read data signal (QVLDA0/1) can be associated with each group of data lines. That is, read data driven on data line group DQA[0:19] can be in synchronism with read data clock QKA0 and indicated as being valid by valid read data signal QVLDA0, and read data driven on data line group DQA[20:39] can be in synchronism with read data clock QKA1 and indicated as being valid by valid read data signal QVLDA1. It is also understood that each data line group (DQA[0:19] and DQA[20:39]) can be connected to a corresponding write data latch (not shown). Each such write data latch can latch write data according to a different write data clock (not shown in FIG. 11A).

It is noted that a grouping of data lines can be physical grouping (i.e., set by design and/or manufacturing steps). However, in alternate embodiments such a grouping can be programmable. In such alternate embodiments, read data drivers circuits can include switching circuits, such a "crossbar" type circuit, to create data line groups.

FIG. 11B is a timing diagram showing two read transactions over data I/O ports 1102-0/1 of FIG. 11A. FIG. 11B includes signals and output values noted in FIG. 11A. In addition, FIG. 11B includes a waveform CK, which can be a clock for latching transaction and/or address values to start a transaction. In FIG. 11A, in response to a first read transaction, a first portion of a read data value (Q00) can be output on data line group DQA[0:19], while a second portion of the read data value (Q01) can be output on data line group DQA[20:39]. Read data value portion Q00 can be output synchronously with the corresponding read data clock QKA0, and indicated as valid by the corresponding valid read data signal QVLDA0. Similarly, read data value portion Q01 can be output synchronously with read data clock QKA1, and indicated as valid by valid read data signal QVLDA1.

Referring still to FIG. 11B, in response to a second read transaction, a read data value (Q10/11) can be output on data line groups DQB[0:19]/DQA[20:39] in the same fashion described above.

In the particular embodiment of FIG. 11B, read data clocks QKA0/1, QKB0/1 can have a predetermined skew with respect to CK.

FIG. 11C is a timing diagram showing two write transactions over data I/O ports 1102-0/1 of FIG. 11A. FIG. 11C includes signals and output values noted in FIG. 11A. In addition, FIG. 11C shows write data clocks DKA0/1, DKB0/1. Write data clocks (DKA0/1, DKB0/1) can latch portions of write data values provided on each port. In FIG. 11C, in response to a first write transaction, a first portion of a write data value (D00) received on data line group DQ[0:19] can be latched according to write data clock DKA0 and a second portion of the write data value (D01) can be latched according to write data clock DKA1.

Referring still to FIG. 11C, in response to a second read transaction, a write data value (D10/11) can be received on data line groups DQB[0:19]/DQA[20:39] and latched according to write data clocks DKB0/1 in the same fashion described above.

In the particular embodiment of FIG. 11C, write data clocks DKA0/1, DKB0/1 can have a predetermined skew with respect to CK.

While FIGS. 11A to 11C show data I/O ports each split into two data line groups, alternate embodiments can include data I/O ports split into more than two different data line groups.

In this way, a memory device can include multiple data I/O ports, with each port split into multiple data line groups, each data line group outputting data and inputting data according to one or more data clocks particular to the data line group.

Figure 12:
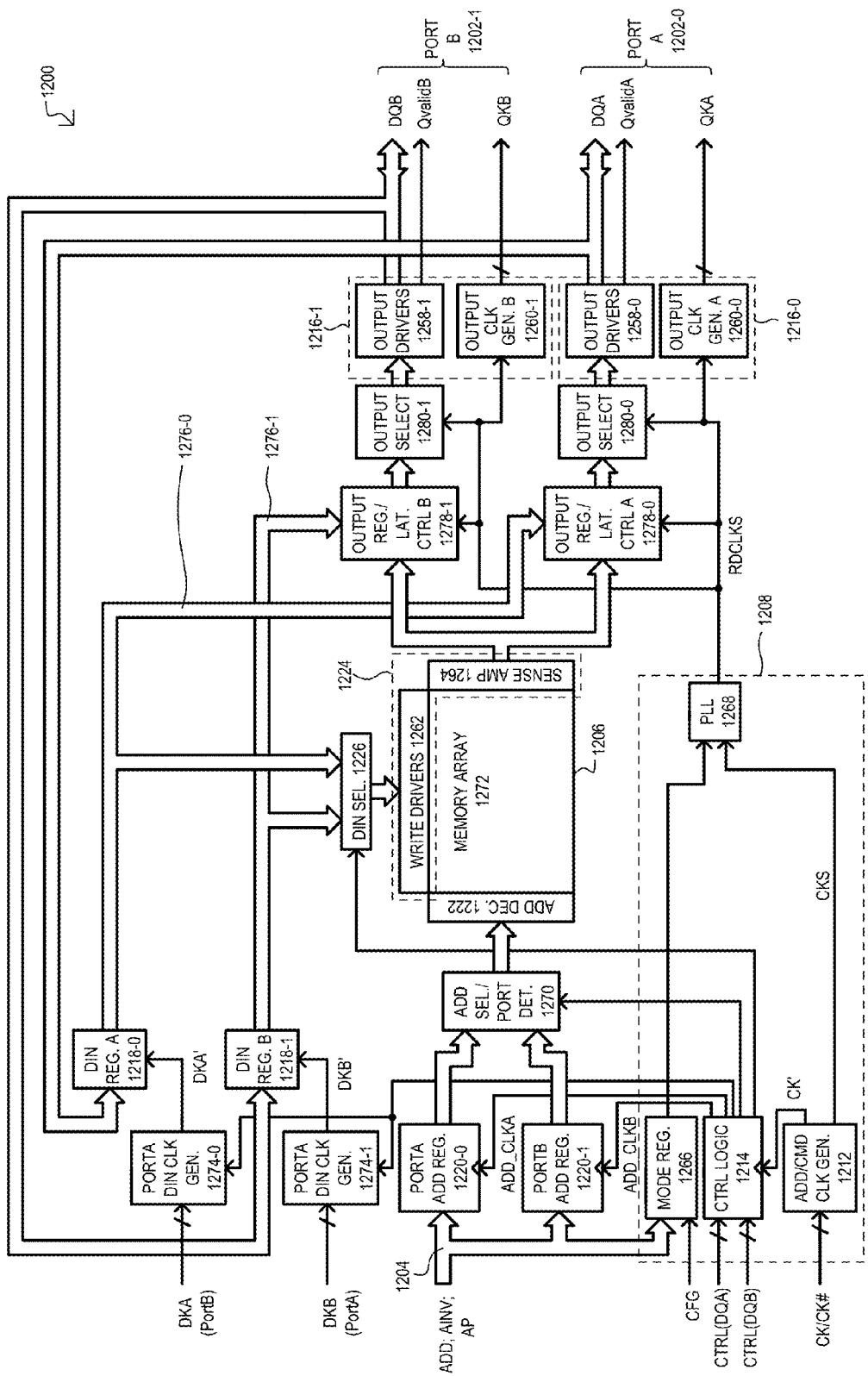
FIG. 12 is a block schematic diagram of a memory device according to a further embodiment.

Referring now to FIG. 12, a memory device according to another embodiment is shown in a block schematic diagram and designated by the general reference character 1200. A memory device 1200 can have sections like those shown in the embodiments of FIG. 1 and FIGS. 4A to 5F, and such like sections are referred to by the same reference characters but with the leading digits being "12" instead of "1" or "4". Such like sections can be the same those described above, or an equivalent.

A memory device 1200 can include an address port 1204 that receives address values (ADD), an address inversion value (AINV), and an address parity value (AP). Address values (ADD) can identify a storage location within a bank of memory array 1272. An address inversion value (AINV) can indicate when received address values (ADD) are in inverted form (ADD is the complement of the desired address). An address parity value (AP) can enable a parity check of a received address.

In the embodiment shown, a control section 1208 can include a clock generator circuit 1212, control logic 1214, a mode register section 1266, and a phase locked loop (PLL) 1268. A mode register section 1266 can receive configuration data CFG that can establish different modes of operation for memory device 1200. In the embodiment shown, address port 1204 can be used to write configuration data into mode register section 1266. In one particular embodiment, one portion of the address inputs of address port 1204 can identify a mode register, while another portion of the address inputs can carry mode data for the identified mode register. Mode values stored in mode register section 1266 can be output via one or more data I/O ports 1202-0/1. In some embodiments, in addition to read/write mode registers, mode register section 1266 can include read only mode registers.

In one embodiment, mode register section 1266 can store mode values that can establish any of the following: operational modes for PLL 1268, data and/or address inversion capability, address parity enable values, data I/O port enable/disable values, initialization modes, and impedance termination values for ports. In addition or alternatively, mode register section 1266 can provide readable locations to indicate parity status (e.g., indicate parity errors in input values, such as address values).

Control logic 1214 can receive transaction data for different data ports (CTRL(DQA)), (CTRL(DQB)), and latch such values according to clock signals CK/CK#. According to latched transaction data, control logic 1214 can issue control signals for various other portions of memory device 1200. In one embodiment, transaction data latched in a rising edge of CK can be directed to one data I/O port 1202-0 and transaction data latched in a falling edge of CK (rising edge of CK#) can be directed to the other data I/O port 1202-1.

A clock generator circuit 1212 can receive one or more input clocks, and in response, generate latching clock(s) CK' for latching transaction data and address values. A clock generator circuit 1212 can provide a source clock CKS to PLL 1268.

A PLL 1268 can generate one or more read clocks (RD-CLKS) that are phase locked to the received source clock CKS. Read clock(s) (RDCLKS) can control read data flow for a memory device 1200.

FIG. 12 also shows an address selection/port detection circuit 1270, which can receive address values from address latches 1220-0/1. From such address values, address selection/port detection circuit 1278 can determine which data I/O port a transaction is directed to, and can detect which bank is accessed by the transaction. In some embodiments, address selection/port detection circuit 1278 can determine when an invalid transaction occurs. More particularly, address selection/port detection circuit 1278 can detect when a same bank is being accessed a second time in the same clock cycle, and prevent such an access from occurring.

In FIG. 12, a memory array section 1206 can include a decoder section 1222, a memory array 1272, and an I/O section 1224. In some embodiments, a decoder section 1222 can determine when an invalid transaction occurs. A memory array 1272 can include storage locations accessed by transactions. In some embodiments, a memory array 1272 can have storage locations arranged into independently accessible banks, and transactions can access such storage locations in a pipelined fashion, as described in embodiments above, or equivalents. An I/O section 1224 can include write data drivers 1262 that can drive write data values to storage locations in memory array 1272, as well as sense amplifiers 1264 for detecting read data values output from memory array 1272.

FIG. 12 also shows write data clock generators 1274-0/1 corresponding to each data I/O port 1202-0/1. Write data clock generators 1274-0/1 can each receive one or more input data clocks (DKA/DKB), and in response, generate latching signals DKA'/DKB' for write data latches 1218-0/1.

Memory device 1200 can provide "full data coherency", enabling a most recently written data value to be output as read data for a storage location. In the embodiment shown, write data latches 1218-0/1 can provide latched write data to both data select circuit 1226, as well as posted write data paths 1276-0/1. Posted write data paths 1276-0/1 can provide latched write data to read data output paths. Thus, when a read transaction is directed to a same location as recently written data, the corresponding read data can be taken from posted write data paths 1276-0/1 instead of the memory array 1272.

Referring still to FIG. 12, a memory device 1200 can include read data paths for each data I/O port 1202-0/1. Each read data path can include a read data output register 1278-0/1, an output selection circuit 1280-0/1, and data driver circuits 1216-0/1. Read data output registers 1278-0/1 can store data from I/O section 1224 of memory array 1272 and/or posted write data paths 1276-0/1. An output selection circuit 1280-0/1 can selectively output read data values from the corresponding read data output register 1278-0/1 to the corresponding data driver circuits 1216-0/1.

Figure 13A:
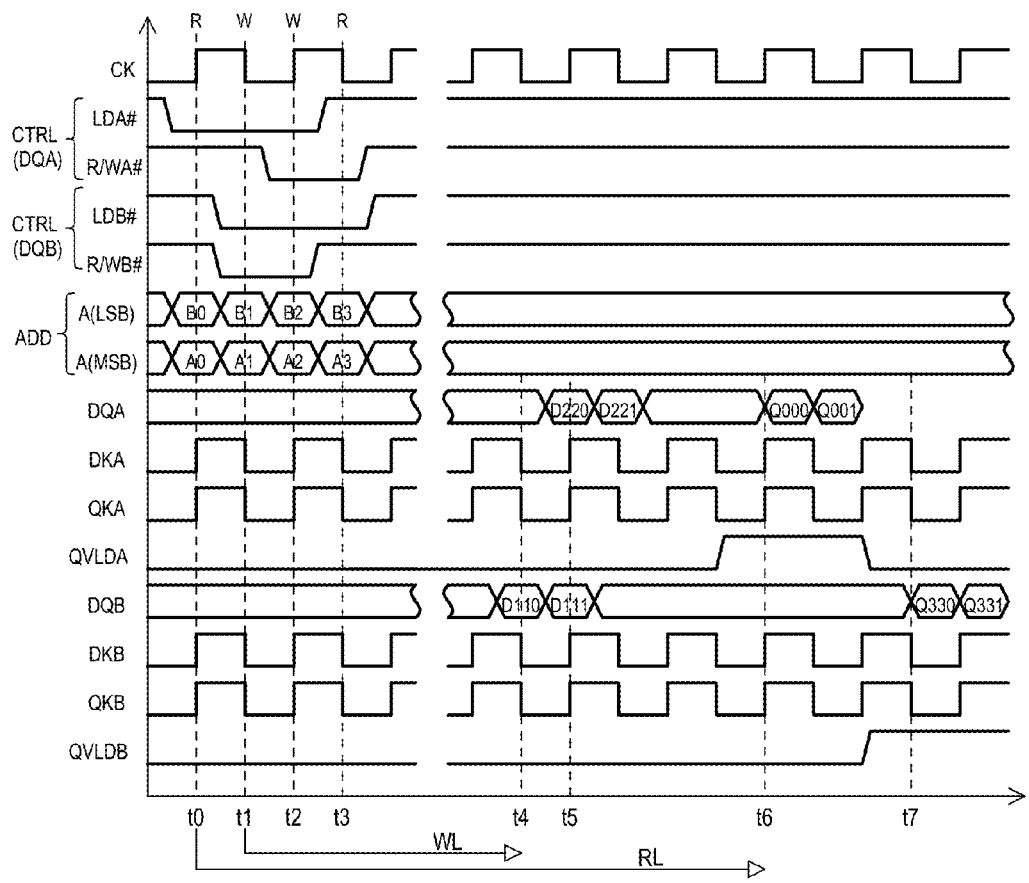
FIGS. 13A to 13C are timing diagrams showing various operations of a memory device like that shown in FIG. 12.
Figure 13B:
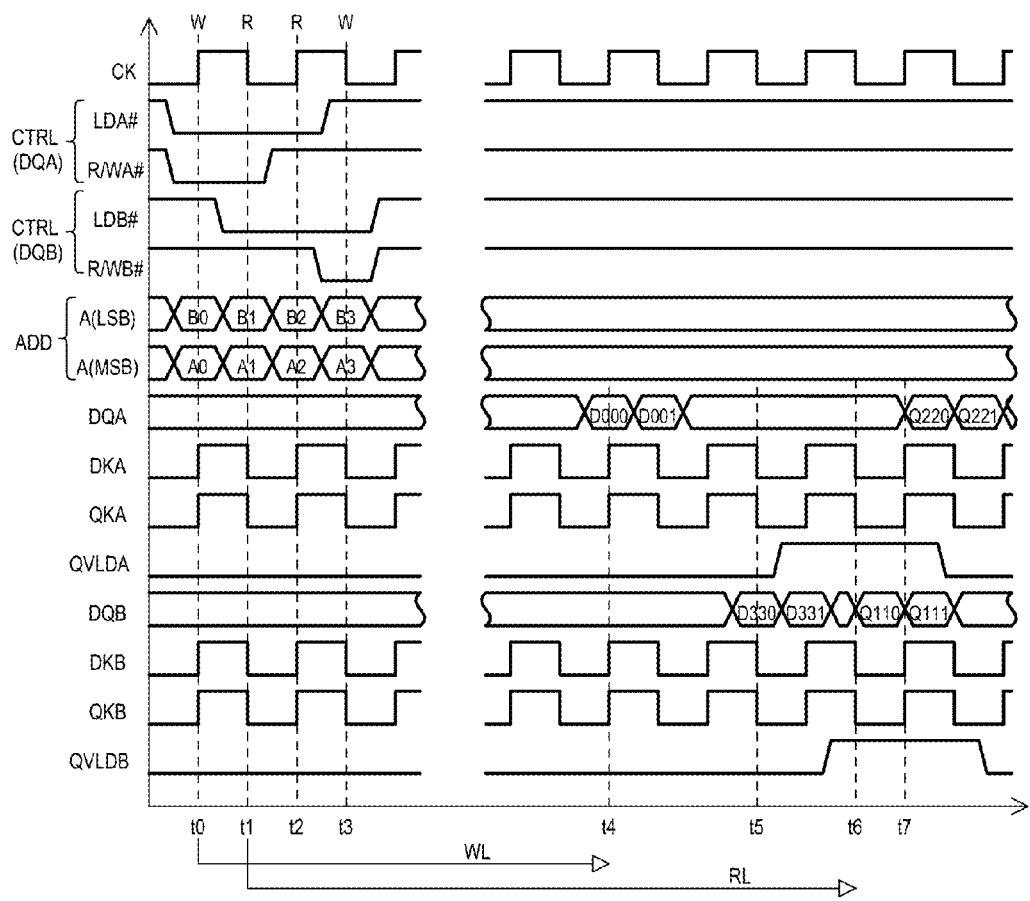
Figure 13C:
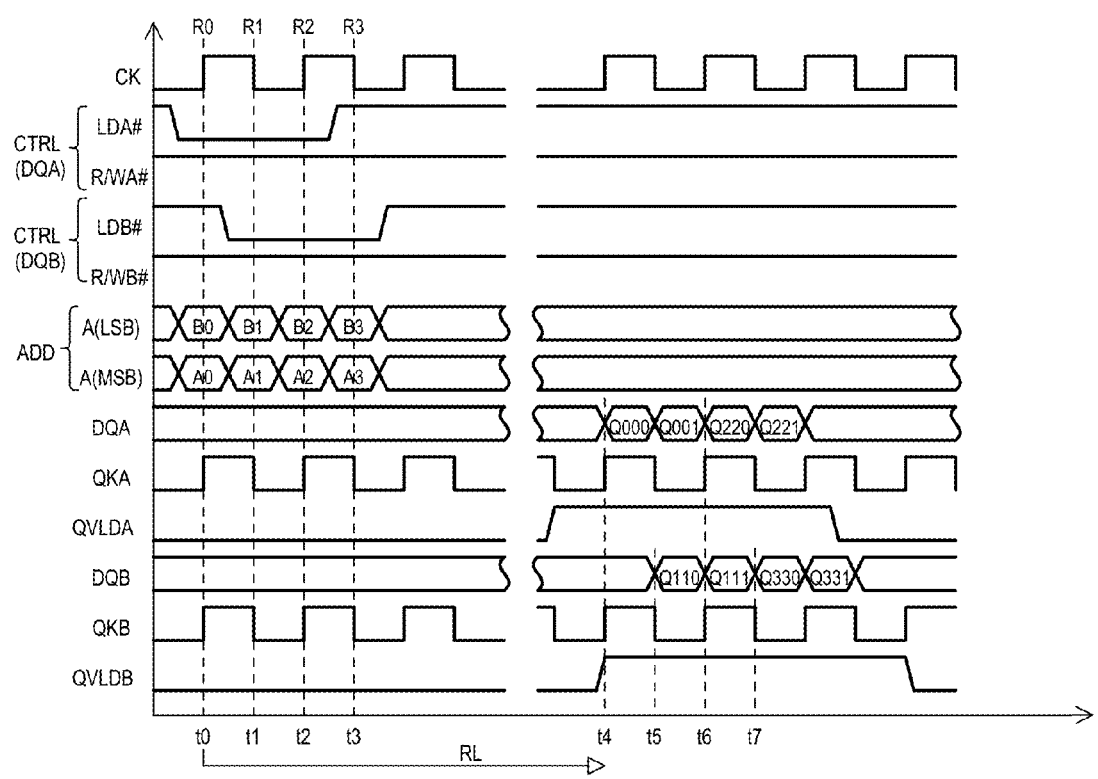

Various operations of memory device 1200 will now be described with reference to FIGS. 13A to 13C. Each of FIGS. 13A to 13C are timing diagrams showing different combinations of four sequential transactions. FIGS. 13A to 13C includes waveforms for various signals described for FIG. 12. Signals ending with the symbol "#" are understood to be active low signals.

In FIGS. 13A to 13C, transaction data for a first data I/O port CTRL(DQA) can include a load signal LDA# and a read/write signal R/WA#. Similarly, transaction data for the other data I/O port CTRL(DQB) can include a load signal LDB# and read/write signal R/WB#. An address value ADD can include one or more less significant bits A(LSB) and more significant bits A(MSB). A(LSB) can identify a bank accessed by a transaction, while A(MSB) can indicate a storage location within the accessed bank.

FIG. 13A shows the following sequence of transactions: read, write, write, read.

At about time t0, clock CK can undergo a rising transition. At this time, load signal LDA# can be low, indicating a transaction via data I/O port DQA. At the same time, read/write signal R/WA# can be high, indicating a read transaction. A(LSB) can indicate the read transaction is directed to bank B0. A(MSB) can identify address A0 within bank B0. In this way, values at time t0 indicate a read transaction to bank B0 via data I/O port DQA. Signals LDA# and R/WA# can be latched by control logic 1214. Address values A(MSB), A(LSB) can be latched in address register 1220-0.

Subsequently, address selection/port detection circuit 1270 can identify a bank for the transaction, and forward the address to address decoder 1222. In one embodiment, because the transaction is initiated on a rising edge of CK, it cannot be an invalid transaction.

At about time t1, clock CK can undergo a falling transition (and/or its complement CK# can undergo a rising transition). At this time, load signal LDB# can be low, indicating a transaction via data I/O port DQB. At the same time, read/write signal R/WB# can be low, indicating a write transaction. A(LSB) can indicate the write transaction is directed to bank B1. A(MSB) can identify address A1 within bank B1. In one embodiment, a bank B1 must be different than the bank accessed in the same cycle (i.e., bank B0 at time t0) in order for the write transaction to be valid. Signals LDB# and R/WB# can be latched by control logic 1214. Address values A(MSB), A(LSB) can be latched in address register 1220-1.

Subsequently, address selection/port detection circuit 1270 can identify a bank for the transaction, and forward the address to address decoder 1222. In one embodiment, address selection/port detection circuit 1270 and/or address decoder 1222 can also determine if a transaction is an invalid transaction.

In this way, two transactions can be issued in the same clock cycle that are directed to different banks.

At about time t2, clock CK can undergo another rising transition. At this time, load signal LDA# can be low, again indicating a transaction via data I/O port DQA. At the same time, read/write signal R/WA# can now be low, indicating a write transaction. A(LSB) can indicate the write transaction is directed to bank B2. A(MSB) can identify address A2 within bank B2. In one embodiment, a bank B2 can be any bank (i.e., it can be bank B1 accessed at time t1, or bank B0, or some other bank).

At about time t3, clock CK can undergo a falling (and/or CK# can undergo a rising transition). At this time, load signal LDB# can be low, indicating a transaction via data I/O port DQB. At the same time, read/write signal R/WB# can be high, indicating a read transaction. A(LSB) can indicate that the read transaction is directed to bank B3. A(MSB) can identify address A3 within bank B3. In one embodiment, a bank B3 must be different than the bank accessed in the same cycle (i.e., bank B2 at time t2) in order for the read transaction to be valid.

Following time t3, the read and write transactions initiated at times t0, t1, t2, and t3 can propagate through memory array 1272 in a pipelined fashion.

At about time t4, a write latency (WL) after time t1, write data values (D110, D111) corresponding to the write transaction initiated at time t1 can be driven on data I/O port DQB. In the embodiment shown, such write data can be latched within write data latch 1218-1 on a falling edge of DKB. Subsequently, such write data can be written into bank B1 at address A1 by write drivers 1262.

At about time t5, a write latency after time t2, write data values (D220, D221) corresponding to the write transaction initiated at time t2 can be driven on data I/O port DQA. In the embodiment shown, such write data can be latched within write data latch 1218-0 on a rising edge of DKA. Subsequently, such write data can be written into bank B2 at address A2 by write drivers 1262.

Prior to time t6, pipelined read operations can continue through banks B0 and B3. Sense amplifiers 1224 can sense read data Q000,Q001 from bank B0 and provide it to read output registers 1278-0. In addition, sense amplifiers 1224 can sense read data Q330,Q331 and provide it to read output registers 1278-1. According to read clock(s) RDCLK such read data values can propagate through read data select circuits 1280-0/1.

At about time t6, a read latency (RL) after time t0, read data values (Q000, Q001) corresponding to the read transaction initiated at time t0 can be driven on data I/O port DQA. Such read data values can be output on a rising edge of data clock QKA. Further, a valid read data signal QVLDA can be activated (driven high in this embodiment) one half cycle (with respect to QKA) before the read data is driven on the data I/O port DQA.

At about time t7, a read latency after time t3, read data values (Q330, Q331) corresponding to the read transaction initiated at time t2 can be driven on data I/O port DQB. Such read data values can be output on a falling edge of data clock QKB. Further, a valid read data signal QVLDB can be activated one half cycle (with respect to QKB) before the read data is driven on the data I/O port DQB.

FIG. 13B shows the following sequence of transactions: write, read, read, write. Such transactions are understood with reference to FIG. 13A, accordingly, such transactions are only summarized below.

At about time t0, a write transaction can be issued to bank B0, address A0. Following a write latency, at about time t4, write data (D000, D001) for such a transaction can be driven on data I/O port DQA.

At about time t1, a read transaction can be issued to bank B1, address A1. Following a read latency, at about time t6, read data (Q110, Q111) for such a transaction can be output on data I/O port DQB.

At about time t2, another read transaction can be issued to bank B2, address A2. Following a read latency, at about time t7, read data (Q220, Q221) for such a transaction can be output on data I/O port DQA.

At about time t3, another write transaction can be issued to bank B3, address A3. Following a write latency, at about time t5, write data (D330, D331) for such a transaction can be driven on data I/O port DQB.

FIG. 13C shows the following sequence of transactions: read, read, read, read. Such transactions are understood with reference to FIGS. 13A and 13B, accordingly, such transactions will not be described in detail.

As noted above, some embodiments can be configured for address and/or data inversion. In such embodiments, an address/data value can be selectively inverted (its complement provided) to a corresponding address port and/or data I/O port (or portion of such a port).

Figure 14:
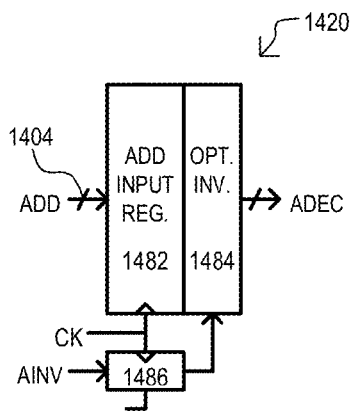
FIG. 14 is a block schematic diagram of an address latch having address inversion according to an embodiment.

FIG. 14 shows an address latch 1420 that can provide address inversion, according to an embodiment. An address latch 1420 can include an address input register 1482, a conditional inversion circuit 1484, and an inversion detection circuit 1486. In the embodiment shown, address input register 1424 can receive address values ADD, and store the address value on a rising edge (or falling edge) of a clock signal CK. In addition, inversion detection circuit 1486 can latch an address inversion value AINV. Conditional inversion circuit 1484 can invert, or not invert, an address value stored by address input register 1424 according to the value AINV, provided from inversion detection circuit.

Figure 15:
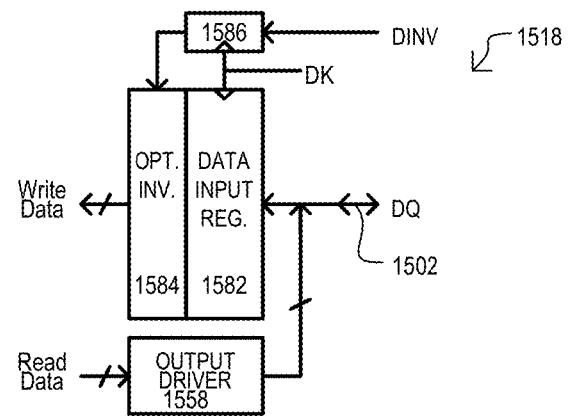
FIG. 15 is a block schematic diagram of a write data latch having data inversion according to an embodiment.

FIG. 15 shows a data latch 1518 that can provide data inversion according to an embodiment. A data latch 1518 can include a data input register 1582, a conditional inversion circuit 1584, and an inversion detection circuit 1586. In the embodiment shown, write data input register 1582 can receive write data values provided on a data I/O port 1502, and store such values on a rising edge (or falling edge) of a data clock signal DK. In addition, inversion detection circuit 1586 can latch an data inversion value DINV. Conditional inversion circuit 1584 can invert, or not invert, a write data value stored by address input register 1582 according to the value DINV, provided from inversion detection circuit 1586. FIG. 15 also shows output driver circuit 1558, which can drive read data on data I/O port 1502.

Figure 16A:
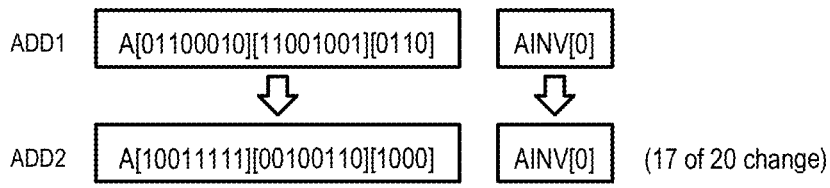
FIGS. 16A and 16B are diagrams showing address inversion that can be included in embodiments.
Figure 16B:
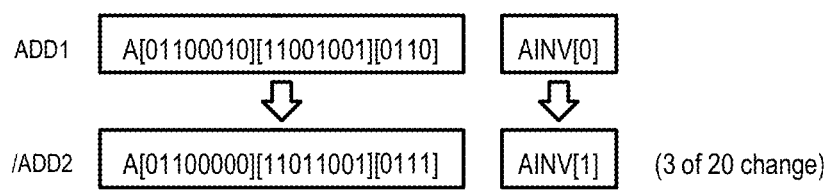

FIGS. 16A and 16B are diagrams showing address inversion operations that can be included in embodiments. FIGS. 16A and 16B show the reception of two address values.

FIG. 16A shows operations without address inversion. A first address ADD1 can be received with a corresponding address inversion value AINV that indicates no address inversion (AINV[0]). A second address ADD2 can be subsequently received, also with no address inversion (AINV[0]). As a result, 17 of 20 address values change (e.g., 17 of 20 address lines are driven to an opposite value from the previous address) when transitioning from ADD1 to ADD2.

FIG. 16B shows the same addresses as FIG. 16A, but utilizing address inversion. In the embodiment shown, a first address ADD1 can be received in the same fashion as FIG. 16A (no inversion). In contrast, a second address ADD2 can be subsequently received that has been inverted (AINV[1]). As a result, only 3 of 20 address values change, reducing line switching.

Data inversion can occur in the same fashion.

It is understood that address and/or data inversion can be performed on only portions of an address and/or data value. In such cases, an inversion value can be provided for each such portion.

While some embodiments shown herein are directed to devices and methods having two data I/O ports, alternate embodiments can include more than two data I/O ports. One particular memory device embodiment having four data I/O ports will now be described.

Figure 17:
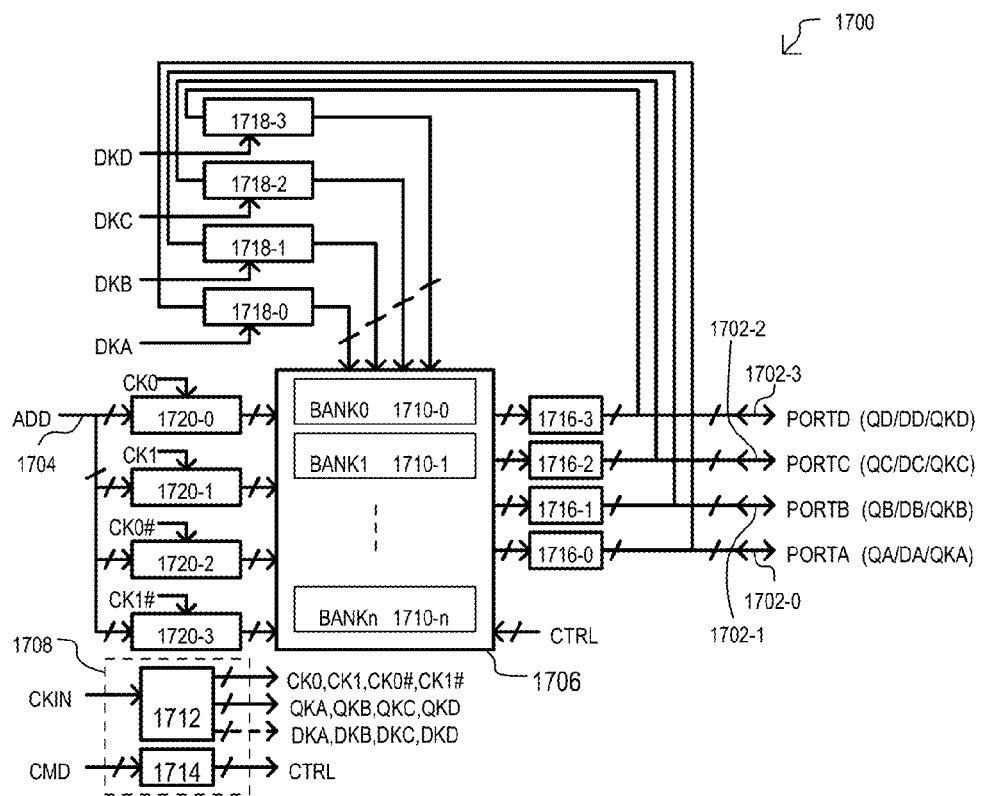
FIG. 17 is a block schematic diagram of a memory device according to another embodiment.

Referring now to FIG. 17, a memory device according to another embodiment is shown in a block schematic diagram and designated by the general reference character 1700. A memory device 1700 can include items like those shown in FIG. 1, and such like items are referred to by the same reference character but with the first digit being a "1" instead of a "17".

The embodiment of FIG. 17 can differ from that of FIG. 1 in that memory device 1700 can include more than two data I/O ports (in the embodiment shown, four data I/O ports 1702-0 to -3). Data I/O ports (1702-0 to -3) can provide independent concurrent data paths for transactions to memory array section 1706. Corresponding to such four data I/O ports (1702-0 to -3) can be four data driver circuits 1716-0 to -3 and four write data latches 1718-0 to -3. Write data latches 1718-0 to -3 can latch write data on their respective data I/O port (1702-0 to -3) in response to data clocks DKA to DKD, respectively.

FIG. 17 also differs from FIG. 1 in that memory device 1700 can include four address latches 1720-0 to -3, each of which can latch an address value for a transaction in response to a different clock signal CK0, CK#, CK1, CK#.

In one embodiment, clocks CK0, CK#, CK1, CK# can have substantially a same frequency, but can be phase shifted with respect to one another. Further, a maximum phase difference between such clock signals (CK0, CK#, CK1, CK#) can be less than a full cycle, enabling four different address values to be latched in one clock cycle. Data clocks DKA to DKD can be can have substantially a same frequency as CK0/CK1, but can be phase shifted with respect to one another, enabling up to four write data values to be latched in one cycle.

Having described sections of a memory device 1700, particular transactions for the memory device will now be described with reference to FIGS. 18A to 18C.

Figure 18A:
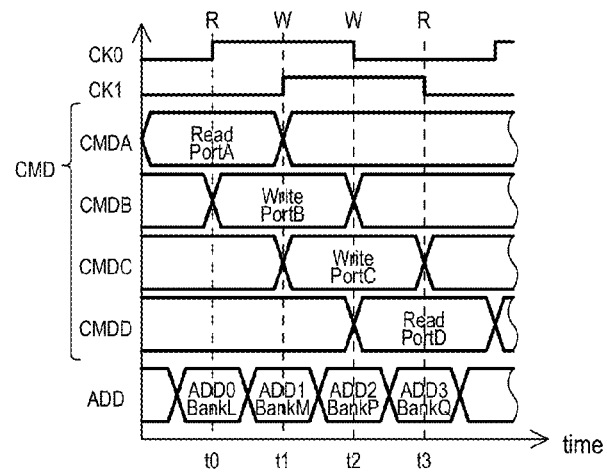
FIGS. 18A to 18C are timing diagrams showing operations of a memory device like that shown in FIG. 17.

FIG. 18A is a timing diagram that includes the following waveforms: CK0 shows a first timing clock; CK1 shows a second timing clock phase shifted by about 90 degrees with respect CK0; CMD shows transaction data; and ADD shows received address data. Transaction data CMD can include: transaction data for Data I/O port 1702-0 (CMDA), transaction data for Data I/O port 1702-1 (CMDB), transaction data for Data I/O port 1702-2 (CMDC), and transaction data for Data I/O port 1702-3 (CMDD).

Figure 18B:
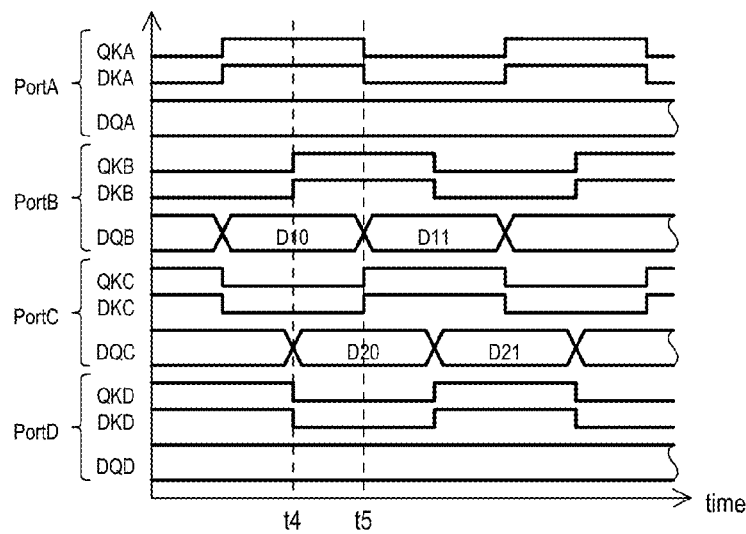

FIG. 18B is a timing diagram showing first actions on data I/O ports in response to the transactions shown in FIG. 18A. FIG. 18B includes waveforms for PortA (1702-0), PortB (1702-1), PortC (1702-2), and PortD (1702-3). Waveforms for each port include Qki, Dki, and DQi, where "i" corresponds to the particular port.

Figure 18C:
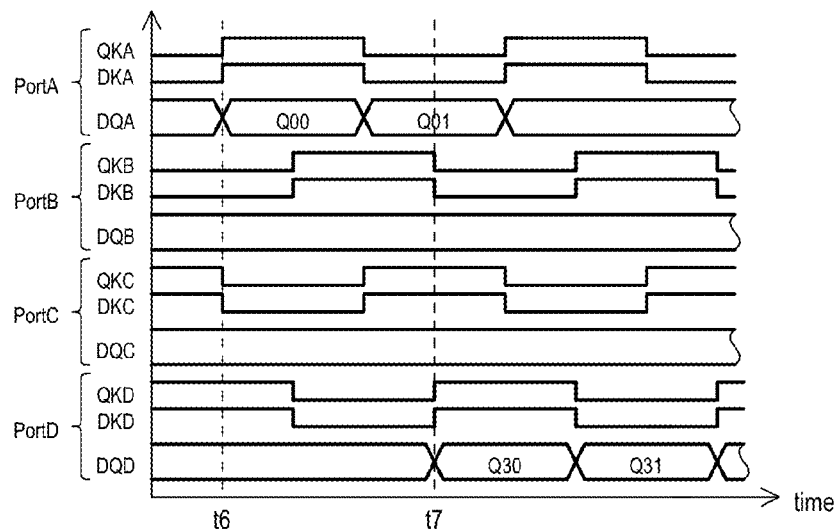

FIG. 18C is a timing diagram showing second actions on data I/O ports, and includes the same waveforms as FIG. 18B.

Referring now to FIGS. 18A to 18C collectively, consecutive read-write-write-read transactions will now be described.

At about time t0, CK0 can transition high and command data can indicate a read operation via Port A (1702-0) to address ADD0 within BankL.

At about time t1, CK1 can make a transition high in a same clock cycle of CK0. At this time, transaction data can indicate a write operation via Port B (1702-1), to address ADD1 within BankM. In one embodiment, such a second address value (ADD1) can be directed to any bank but that accessed at time t0.

At about time t2, CK0 can transition low and transaction data can indicate a second write operation via Port C (1702-2) to address ADD2 within BankP. In one embodiment, such a third address value (ADD2) within the same cycle can be directed to any bank but those accessed previously in the cycle (i.e., BankP is neither BankL nor BankM).

At about time t3, CK1 can transition low and transaction data can indicate a second read operation via Port D (1702-3) at address ADD3 within BankQ. In one embodiment, such a fourth address value (ADD2) within the same cycle can be directed to any bank but those accessed previously in the cycle (i.e., BankP is not BankL nor BankM nor BankP).

At about time t4, following a write latency from time t1, write data D10, D11 can be driven on PortB, and latched on rising and falling edges of write data clock DKB.

At about time t5, following a write latency from time t2, write data D20, D21 can be driven on PortC, and latched on rising and falling edges of write data clock DKA.

At about time t6, following a read latency from time t0, read data Q00, Q01 can be output on PortA synchronously with rising and falling edges of read data clock QKA.

At about time t7, following a read latency from time t3, read data Q30, Q31 can be driven on PortD synchronously with rising and falling edges of read data clock QKD.

In this way, addresses for transactions directed to more than two DDR data I/O ports can be latched within a same clock cycle, to enable highly randomized accesses to storage locations in a memory device.

Embodiments above have shown memory devices, circuits and corresponding methods. Additional methods will now be described with reference to a number of flow diagrams.

Figure 19:
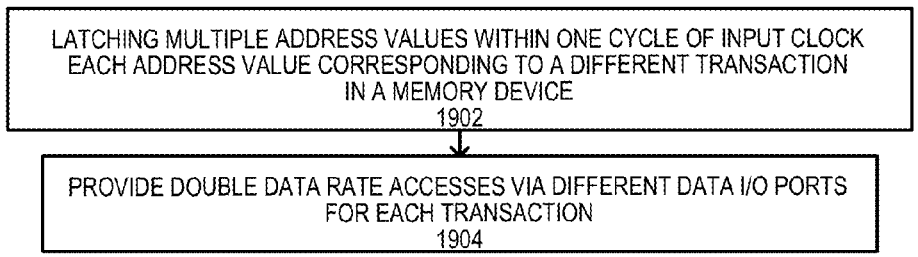
FIG. 19 is a flow diagram of a method according to an embodiment.

FIG. 19 is a flow diagram of a method 1900 according to one embodiment. A method 1900 can include latching multiple address values within one cycle of an input clock, each such address value corresponding to a different transaction in a memory device 1902. A method 1900 can further include providing double data rate accesses to a memory array section via different data input/output (I/O) ports for each transaction 1904. Such an action can include driving write data on, or outputting read data on a same set of I/O lines of a data I/O port according to a transaction type.

Figure 20:
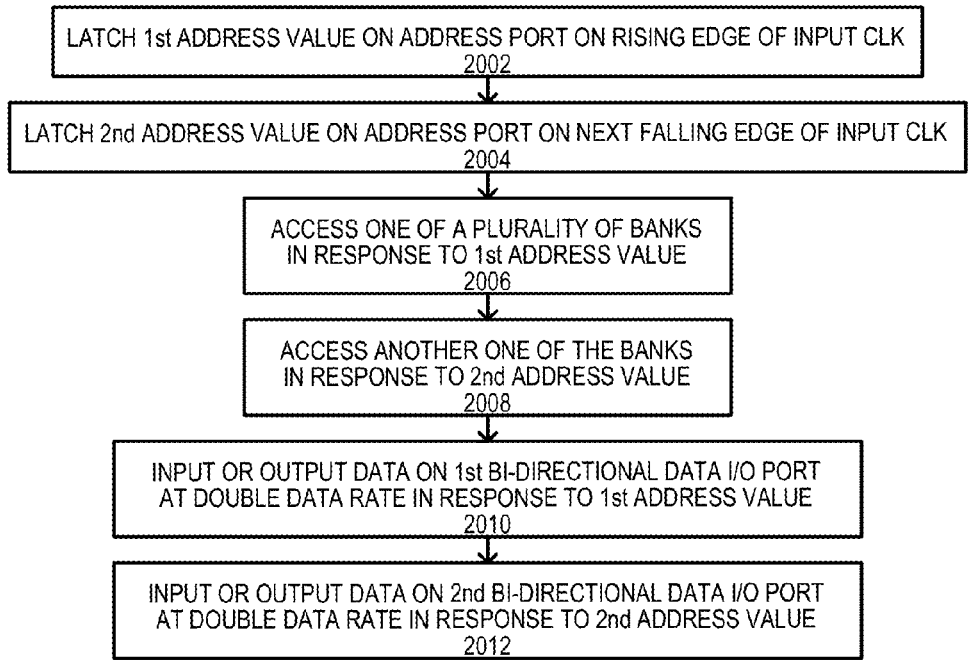
FIG. 20 is a flow diagram of a method according to another embodiment.

FIG. 20 is a flow diagram of a method 2000 according to another embodiment. A method 2000 can include latching a first address value on a rising edge of an input clock 2002. A second address value can be latched on a next falling edge of the input clock 2004. Consequently, two address values can be latched within one cycle of the input clock. It is understood that each of first and second address values can be complete addresses, each identifying a different random storage location for a corresponding transaction. That is, first and second address values are not multiplexed portions of a same address.

Method 2000 can further include accessing one of multiple banks in response to the first address value 2006. Another one of the multiple banks can be accessed in response to the second address value 2008. It is understood that such actions can include any combination of read or write transactions.

Method 2000 can input or output data on a $1^{st}$ bi-directional data I/O port at a double data rate in response to the first address value 2010. Such an action can include reading data from or writing data to locations in the bank noted in box 2006. In some embodiments, a double data rate can be with respect to one or more data clocks operating at the same essential frequency as the input clock noted in boxes 2002/2004.

In a similar fashion, method 2000 can also include input or output data on a $2^{nd}$ bi-directional data I/O port at a double data rate in response to the second address value 2012. Such an action can include reading data from or writing data to locations in the bank noted in box 2008. As in the case of 2010, a double data rate can be with respect to one or more data clocks operating at a same essential frequency as the input clock noted in boxes 2002/2004.

Figure 21:
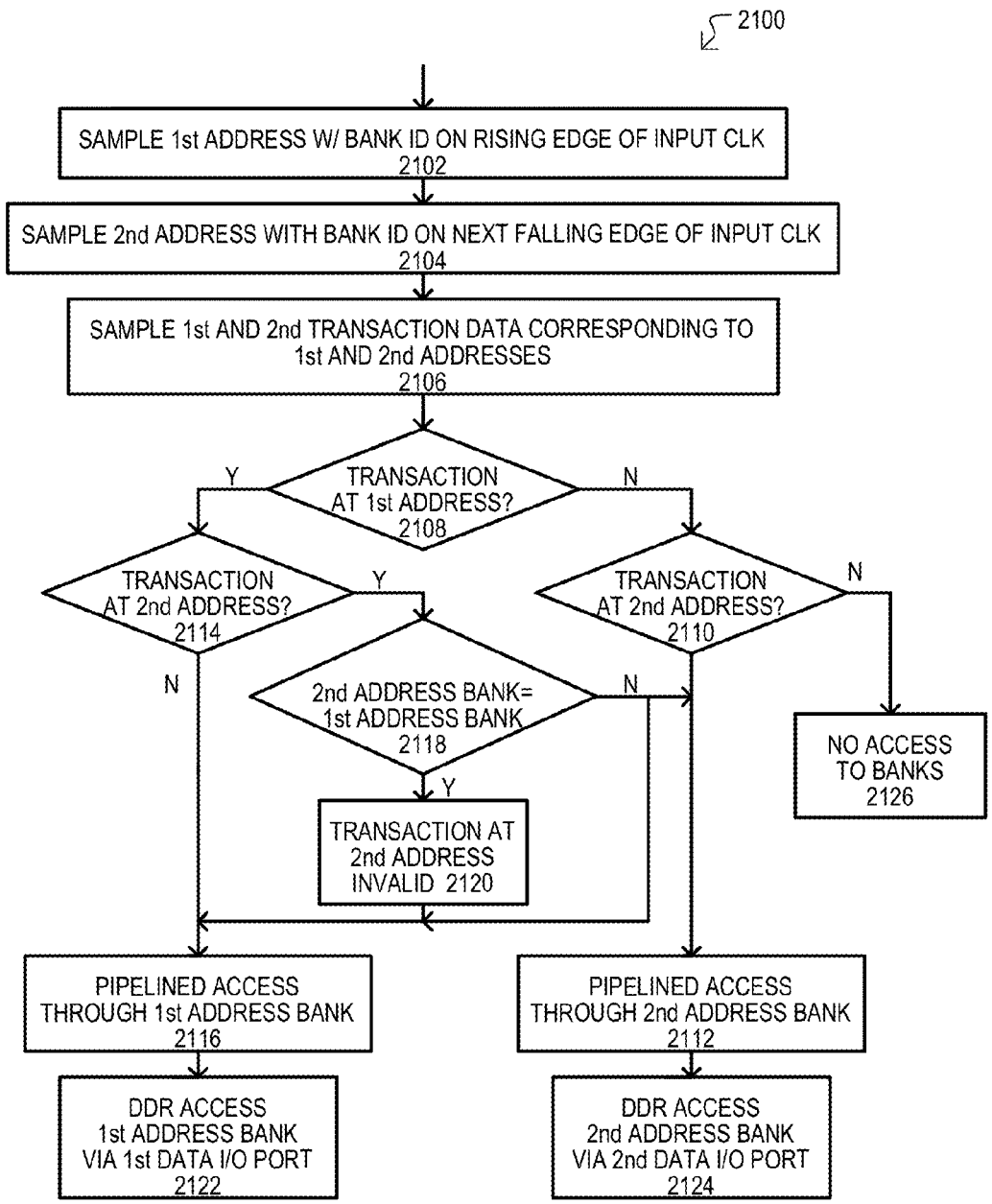
FIG. 21 is a flow diagram of a method according to a further embodiment.

FIG. 21 is a flow diagram of a method 2100 according to a further embodiment. A method 2100 can include sampling a first address (that identifies a bank) on a rising edge of an input clock 2102. A second address (that also identifies a bank) can be sampled on a next falling edge of the input clock 2104.

A method 2100 can also include sampling transaction data corresponding to the first and second addresses 2106. Transaction data can identify a type of transaction to a memory device (e.g., read/write). Transaction data can also indicate if no transaction is to take place. In some embodiments, such an action can include sampling transaction data on rising and falling edges of the input clock noted for boxes 2102/2104. However, in other embodiments, transaction data for both addresses can be sampled on a same edge of an input clock.

A method 2100 can determine if a transaction is associated with the first address 2108. Such an action can include determining if transaction data indicates a read or write transaction for the first address. If such transaction is indicated (Y from 2108), a method 2100 can determine if a transaction is associated with the second address 2114. Like 2108, such an action can include determining if transaction data indicates a read or write transaction for the second address.

If transaction data indicates there is a transaction at the first address but not the second address (N from 2114), a method 2100 can make a pipelined access to a storage location within the bank identified by the first address 2116. Access to such a storage location can be via a first data port, and can be at a double data rate 2122.

If transaction data indicates there are transactions for both the first address and the second address (Y from 2114), a method 2100 can determine whether the bank identified by the second address is the same as that identified by the first address 2118. If the banks are the same (Y from 2118), the transaction to the second address can be determined to be invalid 2120 and a method 2100 can continue to box 2116. If the banks are different (N from 2118), transactions can occur in both banks. That is, a method 2100 can proceed to box 2116, and in addition, can make a pipelined access to a storage location within the bank identified by the second address 2112. Access to such a storage location can be via a second data port, and can be at a double data rate 2124.

Referring still to FIG. 21, if no transaction is indicated for a first address (N from 2108), a method 2100 can determine if a transaction is associated with the second address 2110. If transaction data indicates there is a transaction at the second address but not the first address (Y from 2110), a method 2100 can make a pipelined access to a storage location within the bank identified by the second address (2112, 2124).

If no transactions are indicated for either the first or second address (N from 2110), a method 2100 can make no accesses to storage locations 2126.

It is noted that in embodiments above, a "falling edge" of one clock can be the rising edge of a complementary clock. Further, there can be some skew between the one clock and its complement.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
a plurality of double data rate data (DDR) ports, each configured to receive write data and output read data on a same set of data lines, independently and concurrently, in synchronism with at least a first clock signal;
an address port configured to receive address values on consecutive, different transitions of a second clock, each address value corresponding to an access on a different one of the data ports; and
a memory array section comprising a plurality of banks, each bank providing pipelined access to storage locations therein.

2. The memory device of claim 1, wherein:
the memory array section includes a decoder configured to access one bank in response to a valid transaction and prevent access to any bank in an invalid transaction; wherein
a valid transaction includes any first transaction in one cycle of the second clock and any second transaction in the one cycle that follows the first transaction and that is directed to a bank different from that of the first transaction, and
an invalid transaction includes any second transaction in the one cycle following the first transaction that is directed to a same bank as the first transaction.

3. The memory device of claim 2, further including:
a driver circuit coupled to each data port, each driver circuit being configured to activate a data valid signal in response to a valid read transaction, and de-activate the data valid signal in response to an invalid read transaction.

4. The memory device of claim 1, further including:
each data port includes a plurality of data line sets; and
a driver circuit coupled to each data port that activates a data valid signal corresponding to each data line set in conjunction with the output of valid read data from a transaction on the corresponding data line set.

5. The memory device of claim 1, further including:
a data inversion circuit coupled to each data port, each data inversion circuit configured to selectively invert at least a portion of write data on corresponding data lines, before the write data is applied to the memory array section, in response to at least one input data inversion value.

6. The memory device of claim 1, further including:
control logic coupled to receive command data on a number of control inputs, the control logic latching command data at a slower rate than the double data rate.

7. The memory device of claim 6, wherein:
the control logic latches command data corresponding to a transaction on a first data port on a first type transition of the second clock, and latches command data corresponding to a transaction on a second data port on a second type transition of the second clock.

8. The memory device of claim 1, further including:
an address inversion circuit coupled to the address port, the address inversion circuit configured to selectively invert at least a portion of received address values in response to at least one input address invert value.

9. The memory device of claim 1, wherein:
each bank comprises a plurality of static random access memory (SRAM) cells, each SRAM cell including a latch circuit for storing a data value.

10. A memory device, comprising:
a plurality of double data rate data (DDR) ports, each configured to receive write data and output read data on a same set of data lines, independently and concurrently;
an address decoder
configured to enable a read or write access to a selected bank from a plurality of banks via one of a plurality of data input/output (I/O) ports in response to an address value latched on a first type transition of the first clock, and
configured to enable a read or write access to any bank but the selected bank via another one of the data I/O ports in response to an address value latched on a second type transition that immediately follows the first type transition; and
a memory array section comprising a plurality of banks, each bank providing pipelined access to storage locations therein.

11. The memory device of claim 10, further including:
a first address latch that latches address values received on an address port on a first type transition of the first clock; and
a second address latch that latches address values received on the address port on a second type transition of the first clock.

12. The memory device of claim 10, wherein:
each bank provides pipelined access to storage locations therein independent of accesses to any of the other banks.

13. A method, comprising:
latching multiple address values within one cycle of a first clock, each address value corresponding to a different transaction of a memory device; and
providing double data rate accesses via different data input/output (I/O) ports for each transaction; wherein
each of the different transactions can include any of: a read transaction or a write transaction.

14. The method of claim 13, wherein:
latching multiple address values includes
latching address values received on an address port for a first of the data I/O ports on a rising edge of the first clock, and
latching address values received on the address port for a second of the data I/O ports on a falling edge of the first clock that follows the rising edge.

15. The method of claim 13, wherein:
providing data accesses on each data I/O port includes latching write data on consecutive, different transitions of a write data clock.

16. The method of claim 13, wherein:
providing data accesses on each data I/O port includes outputting read data in synchronism with consecutive, different transitions of a read data clock.

17. The method of claim 13, wherein:
providing data accesses on each data I/O port includes outputting read data in synchronism with consecutive, different transitions of a read data clock with a read latency of at least seven read data clock cycles, the read latency being the time between a latching of an address of the corresponding read transaction and a presence of valid read data on the data I/O port.

18. The method of claim 13, wherein:
providing double data rate accesses via different data I/O ports includes latching write data on consecutive, different transitions of a write data clock with a write latency of at least five write data clock cycles, the write latency being the time between a latching of the address value of the corresponding write transaction and a driving of the write data on the data I/O port.

19. The method of claim 13, further including:

latching transaction values on consecutive, different transitions of the first clock with a corresponding address value, where each transaction value identifies the type of transaction for the address value.

20. The method of claim 13, further including:

selectively inverting latched address values in response to a received address invert value.

* * * * *